United States Patent
Jung

(10) Patent No.: US 9,985,062 B2
(45) Date of Patent: May 29, 2018

(54) IMAGE SENSOR AND METHOD OF MANUFACTURING THE SAME

(71) Applicant: Samsung Electronics Co., Ltd., Suwon-si, Gyeonggi-do (KR)

(72) Inventor: Young-woo Jung, Yongin-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days. days.

(21) Appl. No.: 15/289,316

(22) Filed: Oct. 10, 2016

(65) Prior Publication Data

US 2017/0104019 A1 Apr. 13, 2017

(30) Foreign Application Priority Data

Oct. 12, 2015 (KR) .................. 10-2015-0142168

(51) Int. Cl.
*H01L 23/373* (2006.01)
*H01L 27/146* (2006.01)
*H04N 5/378* (2011.01)

(52) U.S. Cl.
CPC ........ *H01L 27/1462* (2013.01); *H01L 23/373* (2013.01); *H01L 27/14645* (2013.01); *H04N 5/378* (2013.01); *H01L 23/3732* (2013.01); *H01L 23/3738* (2013.01); *H01L 27/1464* (2013.01); *H01L 27/14609* (2013.01); *H01L 27/14623* (2013.01); *H01L 27/14627* (2013.01); *H01L 27/14636* (2013.01)

(58) Field of Classification Search
CPC .......... H01L 27/14643–27/156; H01L 25/167; H01L 31/107; H01L 27/1462; H01L 23/373; H04N 5/378
See application file for complete search history.

(56) References Cited

U.S. PATENT DOCUMENTS

| | | |
|---|---|---|
| 6,319,439 B1 | 11/2001 | Lee et al. |
| 6,534,125 B1 | 3/2003 | Marchywka |
| 8,003,425 B2 | 8/2011 | Adkisson et al. |
| 8,410,528 B2 | 4/2013 | Min |
| 2003/0170458 A1 | 9/2003 | Noguchi |
| 2005/0277224 A1 | 12/2005 | Noguchi |
| 2007/0283881 A1 | 12/2007 | Linares et al. |

(Continued)

FOREIGN PATENT DOCUMENTS

| | | |
|---|---|---|
| KR | 10-0352985 B1 | 9/2002 |
| KR | 2003-0074183 A | 9/2003 |

*Primary Examiner* — Cuong B Nguyen
(74) *Attorney, Agent, or Firm* — Harness, Dickey & Pierce, PLC

(57) ABSTRACT

An image sensor includes a substrate that further includes a sensor array and a heat spreading layer on a surface of the substrate. The heat spreading layer may include one or more of a synthetic diamond layer, a graphene layer, or a diamond-like carbon (DLC) layer. The heat spreading layer enables substantially uniform distribution of heat through at least a portion of the sensor array. Such substantially uniform heat distribution may enable substantially uniform dark current in the portion of the sensor array, thereby reducing a probability of dark shading in the portion of the sensor array. The portion of the sensor array may include an active pixel sensor area. The portion of the sensor array may include an optical black sensor area.

17 Claims, 24 Drawing Sheets

(56) References Cited

U.S. PATENT DOCUMENTS

| | | | |
|---|---|---|---|
| 2008/0093696 A1* | 4/2008 | Takao | H01L 27/14623 |
| | | | 257/432 |
| 2009/0230488 A1 | 9/2009 | Ando | |
| 2010/0230578 A1* | 9/2010 | Horikoshi | H01L 27/14625 |
| | | | 250/208.1 |
| 2012/0043636 A1* | 2/2012 | Nagata | H01L 27/14623 |
| | | | 257/435 |
| 2012/0092834 A1 | 4/2012 | Tain et al. | |
| 2012/0273976 A1 | 11/2012 | David et al. | |
| 2014/0263962 A1* | 9/2014 | Ahn | H01L 27/14618 |
| | | | 250/208.1 |
| 2015/0108502 A1 | 4/2015 | Akiyama et al. | |
| 2015/0123226 A1* | 5/2015 | Choi | H01L 27/1464 |
| | | | 257/432 |
| 2015/0372042 A1* | 12/2015 | Wan | H01L 27/14634 |
| | | | 257/432 |

\* cited by examiner

IMAGE SENSOR AND METHOD OF MANUFACTURING THE SAME

CROSS-REFERENCE TO RELATED APPLICATION

This application claims the benefit of Korean Patent Application No. 10-2015-0142168, filed on Oct. 12, 2015, in the Korean Intellectual Property Office, the disclosure of which is incorporated herein in its entirety by reference.

BACKGROUND

The inventive concepts relate to image sensors and methods of manufacturing the same, and more particularly, to backside-illumination-type image sensors and method of manufacturing the same.

An image sensor may convert an optical image signal into an electric signal. The image sensor may include an active pixel sensor area and a circuit area. The active pixel sensor area may receive incident light and convert the incident light into an electric signal. The circuit area may provide a desired (or, alternatively, predetermined) signal to each unit pixel of the active pixel sensor area or control an output signal of each unit pixel. When heat is generated during an operation of the circuit area, a dark current may be generated in a portion of the active pixel sensor area proximate to the circuit area, and resolution of the image sensor may be degraded.

SUMMARY

The inventive concepts provide an image sensor by which a dark current may be reduced and uniform, excellent resolution may be obtained in the entire active pixel sensor area.

The inventive concepts also provide a method of manufacturing the image sensor.

According to some example embodiments of the inventive concepts, an image sensor may include a first substrate, a microlens, a multilayered interconnection structure, and a heat spreading layer. The first substrate may include a first surface and a second surface. The first and second surfaces may be opposite surfaces of the first substrate. The first substrate may further include an active pixel sensor area. The active pixel sensor area may include a photoelectric conversion region. The microlens may be on the first surface. The multilayered interconnection structure may be on the second surface. The heat spreading layer may be on the first surface or the second surface. The heat spreading layer may include a synthetic diamond layer, a graphene layer, or a diamond-like carbon (DLC) layer.

According to some example embodiments of the inventive concepts, an image sensor may include a first substrate, a microlens, a multilayered interconnection structure, and a heat spreading layer. The first substrate may include a first surface and a second surface. The first and second surfaces may be opposite surfaces of the first substrate. The first substrate may include an active pixel sensor area. The active pixel sensor area may include a photoelectric conversion region. The microlens may be on the first surface. The multilayered interconnection structure may be on the second surface. The heat spreading layer may be either the first surface or the second surface. The heat spreading layer may vertically overlap an entire area of the active pixel sensor area.

According to some example embodiments of the inventive concepts, a method of manufacturing an image sensor may include forming an active pixel sensor area on a first substrate, forming a heat spreading layer on the active pixel sensor area, and forming a microlens on the heat spreading layer. The active pixel sensor area may include a photoelectric conversion region. The heat spreading layer may include a synthetic diamond layer, a graphene layer, or a diamond-like carbon (DLC) layer.

According to some example embodiments of the inventive concepts, an image sensor may include a substrate and a heat spreading layer on a surface of the substrate. The substrate may include a sensor array and a plurality of circuits. The sensor array may include a plurality of unit pixels. Each unit pixel may include a photoelectric conversion region. Each unit pixel may be configured to generate an electrical output signal. The plurality of circuits may be configured to generate driving signals to drive one or more unit pixels of the plurality of unit pixels and receive electrical output signals generated by one or more unit pixels of the plurality of unit pixels. The heat spreading layer may be configured to substantially uniformly distribute heat generated by at least one circuit of the plurality of circuits across at least a portion of the plurality of unit pixels.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF THE EMBODIMENTS

Figure 1:
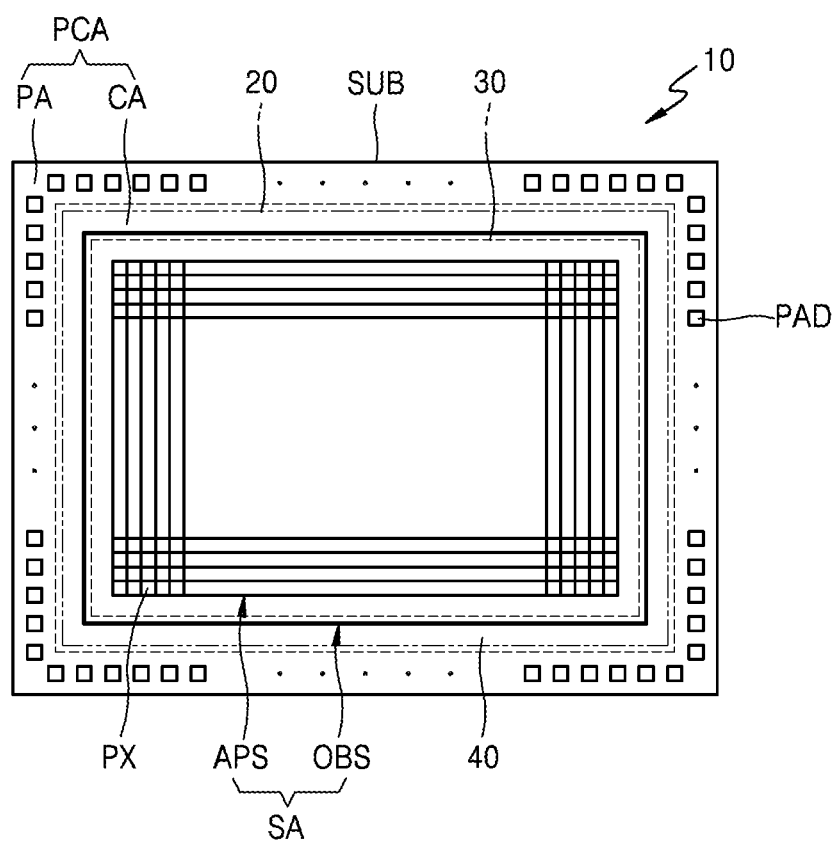
FIG. 1 is a schematic plan view of an image sensor according to some example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
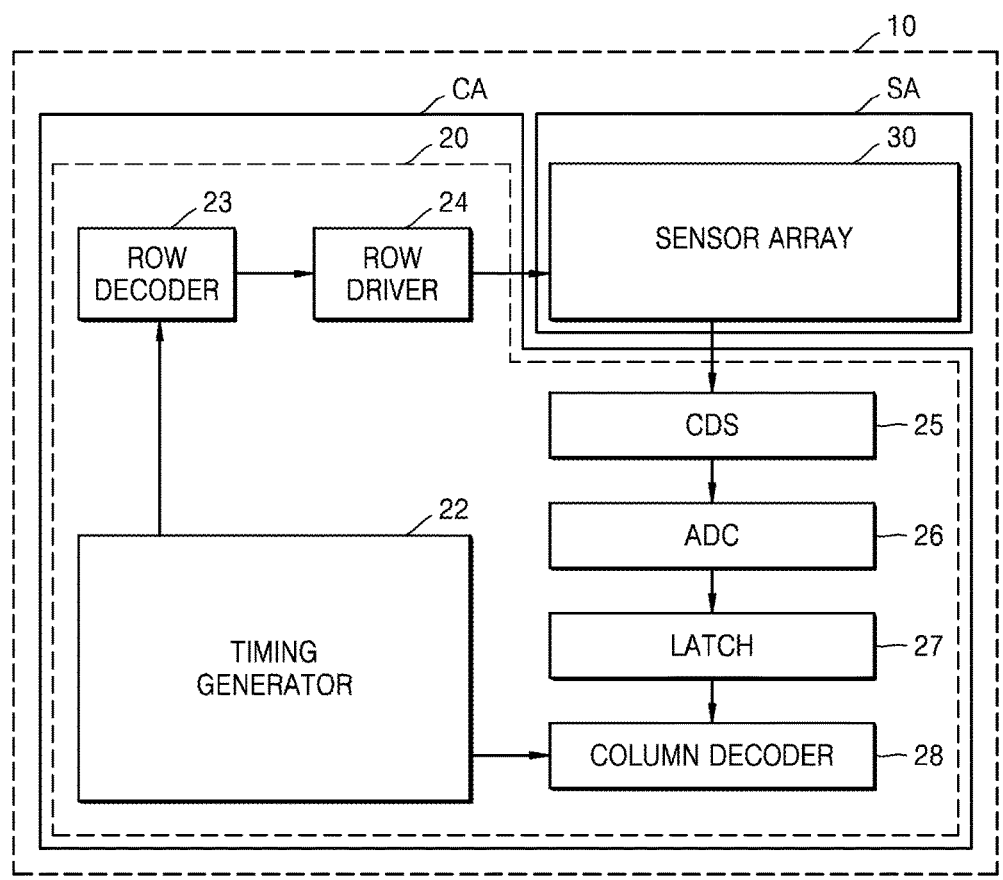
FIG. 2 is a block diagram of some elements of an image sensor according to some example embodiments.

FIG. 1 is a schematic plan view of an image sensor 10 according to some example embodiments. FIG. 2 is a block diagram of some elements of the image sensor 10.

Referring to FIGS. 1 and 2, the image sensor 10 may include a sensor array area SA and a peripheral circuit area PCA located around the sensor array area SA.

The sensor array area SA may include an active pixel sensor area APS and an optical black sensor area OBS. The active pixel sensor area APS may include one or more active pixels configured to generate active signals corresponding to wavelengths of external light. The optical black sensor area OBS may include optical black pixels configured to block external light and generate optical black signals. Although not shown, a dummy pixel sensor area (not shown) may be located in an edge portion of the active pixel sensor area APS, which is close to the optical black sensor area OBS.

In some embodiments, a plurality of pads PAD located in a pad area PA may exchange electric signals with an external apparatus. In some other embodiments, the plurality of pads PAD may serve to transmit externally supplied driving power (e.g., a power supply voltage or a ground voltage) to circuits located in the circuit area CA.

The sensor array area SA may include a sensor array 30 including a plurality of unit pixels PX. Each of the plurality of unit pixels PX may include a photoelectric conversion region (not shown). As shown in FIG. 1, the sensor array 30 may include both the active pixel sensor area APS and the optical black sensor area OBS. The plurality of unit pixels PX included in the sensor array 30 may include at least some of the active pixels of the active pixel sensor area APS and at least some of the optical black pixels of the optical black sensor area OBS.

The peripheral circuit area PCA may include a circuit area CA including a plurality of circuits 20 and a pad area PA including a plurality of pads PAD located around the circuit area CA. The circuit area CA may include a plurality of CMOS transistors (not shown) and be configured to transmit a desired (or, alternatively, predetermined) signal to each of the unit pixels PX of the sensor array area SA or control an output signal of each of the unit pixels PX. In some example embodiments, the circuit area CA may surround the sensor array area SA, such that the sensor array area SA is surrounded by the circuit area CA and is external to the circuit area CA.

As shown in FIG. 2, the plurality of circuits 20 included in the circuit area CA may include a timing generator 22, a row decoder 23, a row driver 24, a correlated double sampler (CDS) 25, an analog-to-digital converter (ADC) 26, a latch 27, and a column decoder 28.

The sensor array 30 included in the sensor array area SA may receive a plurality of driving signals, including at least one of a row selection signal, a reset signal, and a charge transmission signal, from the row driver 24. The sensor array 30 may be driven in response to the received driving signal. Also, an electric output signal may be generated by the sensor array 30 based on a photoelectric conversion operation in the sensor array 30. The electric output signal may be provided to the CDS 25.

The timing generator 22 may provide a timing signal and a control signal to the row decoder 23 and the column decoder 28.

The row driver 24 may provide (e.g., "generate") a plurality of driving signals for driving a plurality of unit pixels to the sensor array 30 of the sensor array area SA based on results decoded by the row decoder 23. When the plurality of unit pixels PX are arranged as a matrix, the row decoder 24 may provide a driving signal to each of rows of the matrix.

The CDS 25 may receive an output signal from the sensor array 30 of the sensor array area SA and maintain and sample the received signal. Specifically, the CDS 25 may doubly sample a specific noise level and a signal level of the output signal and output a difference level corresponding to a difference between the noise level and the signal level.

The ADC 26 may convert an analog signal corresponding to the difference level into a digital signal and output the digital signal.

The latch 27 may latch digital signals, and the latched signals may be sequentially output to an image signal output unit (not shown) based on results decoded by the column decoder 28.

In some example embodiments, the image sensor 10 may be a backside illumination-type CMOS image sensor. Light may be incident from an exposed surface of the image sensor 10 on which the plurality of pads PAD are exposed, to a portion of the sensor array area SA except the optical black sensor area OBS. Although not shown in FIGS. 1 and 2, the image sensor 10 may include a heat spreading layer 160 (refer to FIG. 4) located on an entirety or substantial entirety of (e.g., an entire area or substantially entire area of) the active pixel sensor area APS and the optical black sensor area OBS. The heat spreading layer 160 may include a material having both a high thermal conductivity and a high light transmittance. A temperature of the substrate SUB may be comparatively uniformly or substantially uniformly maintained on the entire area of the active pixel sensor area APS and the optical black sensor area OBS, based on the heat spreading layer uniformly or substantially uniformly distributing heat across the entire area. For example, heat is generated proximate to a limited portion of the active pixel sensor area APS and the optical black sensor area OBS, the heat spreading layer may uniformly or substantially uniformly distribute the generated heat across the entire area or substantially entire area of the active pixel sensor area APS and the optical black sensor area OBS. Also, heat generated during operations of the plurality of circuits 20 may be uniformly or substantially uniformly distributed on ("over") the entire areas of the active pixel sensor area APS and the optical black sensor area OBS. Accordingly, based on the uniform or substantially uniform distribution of heat over the APS, a sufficiently great and non-uniform dark current in the APS to result in dark shading on the APS may be reduced and/or prevented from occurring in the active pixel sensor area APS adjacent to the source of generated heat (e.g., a portion of circuit area CA), and the image sensor 10 may provide a uniform or substantially uniform resolution. Furthermore, the image sensor 10 may be configured to provide improved resolution, relative to an image sensor 10 in which the heat spreading layer is absent, based on the reduction and/or prevention of a sufficiently large and non-uniform dark current to induce dark shading on the APS.

Figure 3:
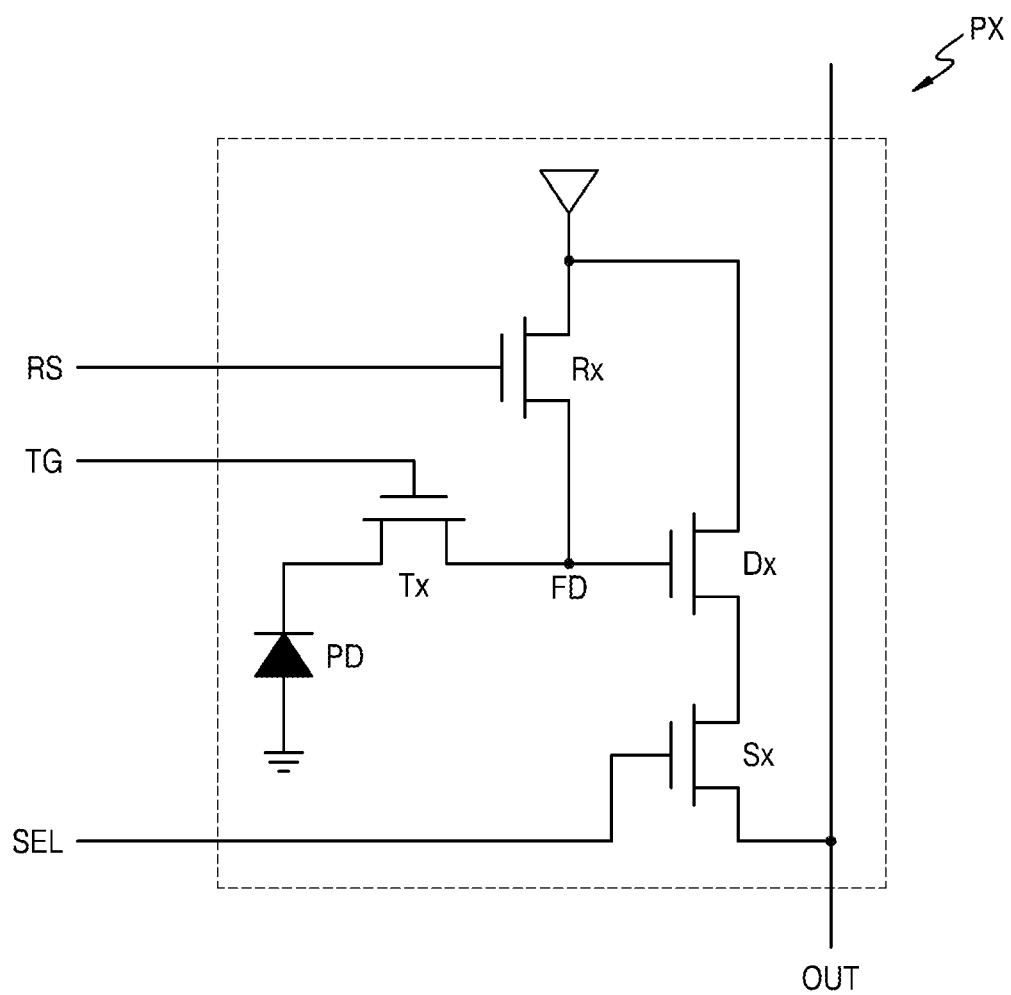
FIG. 3 is an equivalent circuit diagram of a unit pixel included in a sensor array in a sensor array area of FIG. 1.

FIG. 3 is an equivalent circuit diagram of a unit pixel PX included in the sensor array 30 of the sensor array area SA of FIG. 1.

Referring to FIG. 3, the unit pixel PX may include a photodiode PD configured to receive light, generate photocharges due to a photoelectric conversion operation, and accumulate the generated photocharges. The unit pixel PX may include a transfer transistor Tx configured to transfer the photocharges generated by the photodiode PD to a floating diffusion (FD) region. The unit pixel PX may include a reset transistor Rx configured to periodically reset the photocharges stored in the floating diffusion region FD. The unit pixel PX may include a drive transistor Dx serving as a source follower buffer amplifier and configured to buffer a signal corresponding to the photocharges filled in the floating diffusion region FD. The unit pixel PX may include a select transistor Sx configured to perform switching and addressing operations for selecting a unit pixel Px. In FIG. 3, a signal "RS" may be a signal applied to a gate of the reset transistor Rx, a signal "TG" may be a signal applied to a gate of the transfer transistor Tx, and a signal "SEL" may be a signal applied to a gate of the select transistor Sx.

FIG. 3 illustrates an example of a circuit configuration of a unit pixel PX including one photodiode PD and four MOS transistors Tx, Rx, Dx, and Sx, but the inventive concepts is not limited thereto.

Referring back to FIG. 1, in the sensor array area SA, a plurality of unit pixels PX formed in the optical black sensor area OBS may be covered with a light shielding layer 40. The plurality of unit pixels PX formed in the optical black sensor area OBS may be used to measure a dark current. A power supply, which is the same as a power supply supplied to the sensor array 30 located in the active pixel sensor area APS, may be connected to the sensor array 30 located in the optical black sensor area OBS. Accordingly, it may be possible to transmit a noise, which is the same as a power supply noise generated in the active pixel sensor area APS, by using an output signal of the optical black sensor area OBS. Also, since the sensor array 30 located in the optical black sensor area OBS is blocked from light by the light shielding layer 40, a power supply noise element may be transmitted by using a black level signal generated by the sensor array 30 located in the optical black sensor area OBS.

Figure 4:
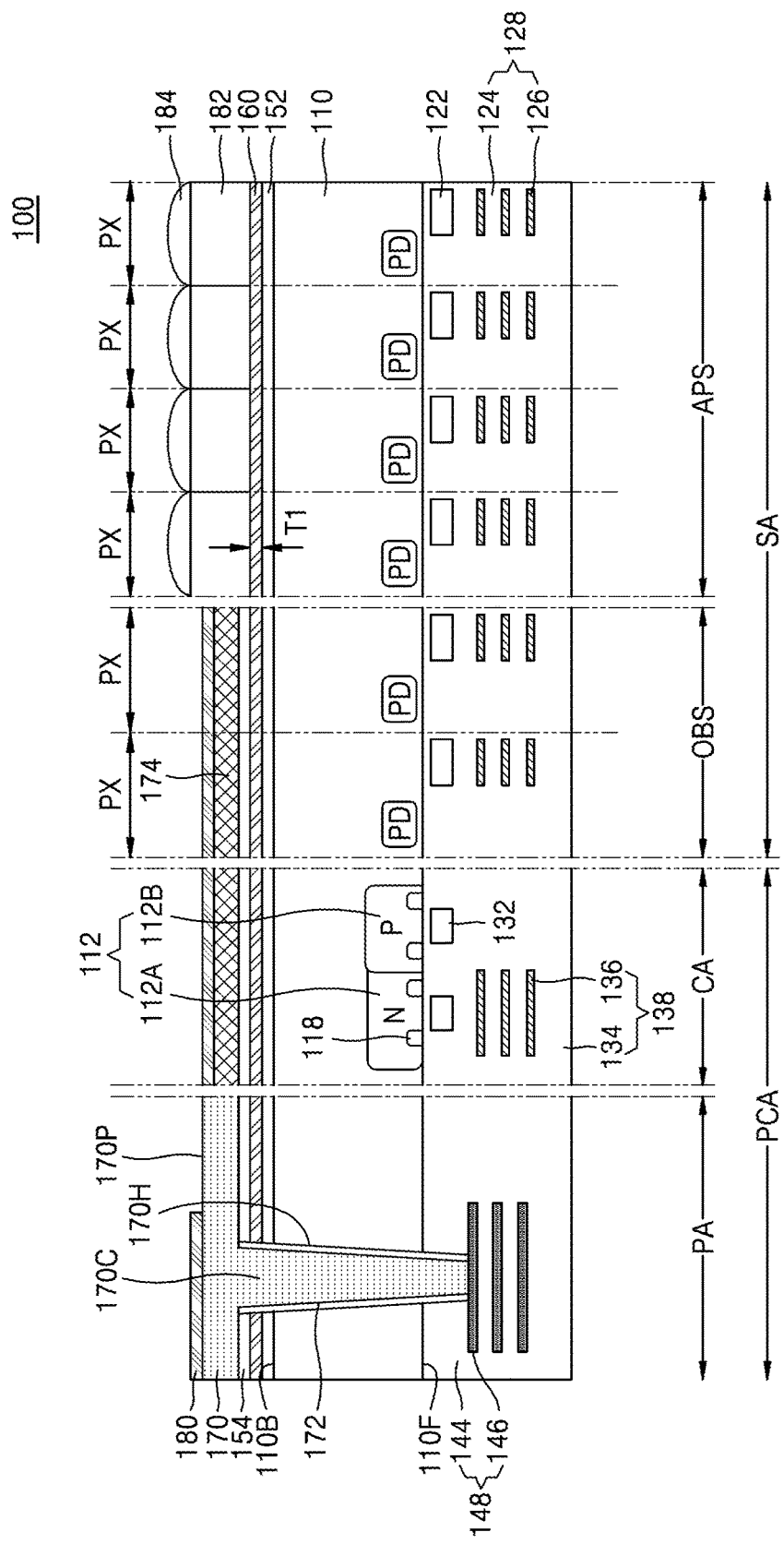
FIG. 4 is a cross-sectional view of an image sensor according to some example embodiments.

FIG. 4 is a cross-sectional view of an image sensor 100 according to some example embodiments. In FIG. 4, the same reference numerals are used to denote the same elements as in FIGS. 1 to 3, and detailed descriptions thereof are omitted for brevity.

Referring to FIG. 4, a substrate 110 of the image sensor 100 may include a sensor array area SA and a peripheral circuit area PCA located around the sensor array area SA.

The sensor array area SA may include an active pixel sensor area APS and an optical black sensor area OBS. The active pixel sensor area APS may include a plurality of unit pixels PX (refer to FIG. 1) configured to generate active signals corresponding to wavelengths of external light. The optical black sensor area OBS may include an optical black pixel (not shown) configured to block external light and generate an optical black signal. The optical black pixel may have a structure similar to the unit pixel PX of the active pixel sensor area APS.

The peripheral circuit area PCA may include a circuit area CA and a pad area PA. The pad area PA may be located around the sensor array area SA, and the circuit area CA may be located between the pad area PA and the sensor array area SA.

The substrate 110 may include a first surface 110B and a second surface 110F, which are opposite to each other (e.g., are on opposite ends of the substrate 110). In some example embodiments, the substrate 110 may include a P-type semiconductor substrate. For example, the substrate 110 may include a P-type silicon substrate. In some example embodiments, the substrate 110 may include a P-type bulk substrate and a P-type or N-type epi layer grown on the P-type bulk substrate. In some example embodiments, the substrate 110 may include an N-type bulk substrate and a P-type or N-type epi layer grown on the N-type bulk substrate. In some example embodiments, the substrate 110 may include an organic plastic substrate.

In the sensor array area SA, a photoelectric conversion region (e.g., a photodiode PD) and a plurality of impurity diffusion regions (not shown) may be formed in the substrate 110. Also, a gate electrode 122 may be formed on the second surface 110F of the substrate 110. The gate electrode 122 may be a portion of a transistor Tx (refer to FIG. 3), a transfer transistor Tx (refer to FIG. 3), a reset transistor Rx (refer to FIG. 3), a drive transistor Dx (refer to FIG. 3), or a select transistor Sx (refer to FIG. 3) included in the unit pixel PX.

In the sensor array area SA, a multilayered interconnection structure 128 may be formed on the second surface 110F of the substrate 110. The multilayered interconnection structure 128 may include an insulating interlayer 124 and a plurality of interconnection lines 126. Among the plurality of interconnection lines 126, adjacent interconnection lines 126 may be insulated from one another by the insulating interlayer 134. The insulating interlayer 124 may also cover one or more of the gate electrodes 122.

In the circuit area CA, a plurality of wells 112, which may at least partially comprise a plurality of circuits 20 (refer to FIG. 2), may be formed in the substrate 110. The plurality of wells 112 may include a first-conductivity-type first well 112A and a second-conductivity-type second well 112B. A second-conductivity type may be a conductivity type opposite to a first conductivity type. FIG. 4 illustrates some example embodiments where the first well 112A is an N-type well and the second well 112B is a P-type well, but the inventive concepts are not limited thereto. A plurality of first wells 112A and a plurality of second wells 112B may be formed in the substrate 110.

In the circuit area CA, a plurality of gate electrodes 132, which may at least partially comprise the plurality of circuits 20 (refer to FIG. 2), may be formed on the second surface 110F of the substrate 110. In some embodiments, a plurality of source and drain regions 118 may be formed on both sides of the gate electrodes 132 in the plurality of wells 112. In some embodiments, the plurality of source and drain regions 118 may constitute transistors along with the gate electrodes 132.

In the circuit area CA, a multilayered interconnection structure 138 may be formed on the second surface 110F of the substrate 110. The multilayered interconnection structure 138 may include an insulating interlayer 134 and a plurality of interconnection lines 136. Among the plurality of interconnection lines 136, adjacent interconnection lines 136 may be insulated from one another by the insulating interlayer 134.

In the pad area PA, a multilayered interconnection structure 148 may be formed on the second surface 110F of the substrate 110. The multilayered interconnection structure 148 may include an insulating interlayer 144 and a plurality of interconnection lines 146. Among the plurality of interconnection lines 146, adjacent interconnection lines 146 may be insulated from one another by the insulating interlayer 144.

In the sensor array area SA and the peripheral circuit area PCA, a first insulating layer 152 may be located on the first surface 110B of the substrate 110. In some example embodiments, the first insulating layer 152 may include a metal oxide, such as hafnium oxide (HfOx) or aluminum oxide (AlOx). However, the inventive concepts are not limited thereto. The first insulating layer 152 may include a metal oxide or metal oxynitride having negative fixed charges. In this case, a hole accumulation layer (not shown) may be formed at an interface between the first insulating layer 152 and the first surface 110B of the substrate 110 including, for example, silicon. The hole accumulation layer may allow electrons formed due to thermal energy to recombine with holes accumulated at the interface. Accordingly, a dark current, which is caused by generation of thermoelectrons due to thermal energy even if light is not externally received, may be reduced.

In some example embodiments, the first insulating layer 152 may be located on substantially the entire area of the sensor array area SA and at least a portion of the peripheral circuit area PCA. As shown in FIG. 4, the first insulating layer 152 may be located on the entire areas of the active pixel sensor area APS and the optical black sensor area OBS and extend to the circuit area CA and the pad area PA. However, the inventive concepts are not limited thereto, and the first insulating layer 152 may be formed only on the active pixel sensor area APS and the optical black sensor area OBS.

In the sensor array area SA and the peripheral circuit area PCA, a heat spreading layer 160 may be located on the first insulating layer 152. In some example embodiments, the heat spreading layer 160 may include a material having high thermal conductivity and light transmittance. For example, the heat spreading layer 160 may be a synthetic diamond layer, a graphene layer, or a diamond-like carbon (DLC) layer. However, the inventive concepts are not limited thereto. For example, in addition to the above-described synthetic diamond layer or graphene layer, the heat spreading layer 160 may include any material having a thermal conductivity of about 1 W/m·K or higher.

In some example embodiments, the heat spreading layer 160 may be a synthetic diamond layer formed by using a chemical vapor deposition (CVD) process. The heat spreading layer 160 may have a first thickness T1 of about several tens of nm to several hundreds of nm.

In some example embodiments, the heat spreading layer 160 may be a p-type doped graphene layer, an n-doped graphene layer, or an undoped graphene layer. Here, graphene may refer to a single layer including a two-dimensional (2D) sheet including carbon atoms or a stacked structure including one of two to ten layers. The heat spreading layer 160 may have a first thickness T1 of about several nm to about several tens of nm.

As shown in FIG. 4, the heat spreading layer 160 may be formed on substantially the entire areas of the active pixel sensor area APS and optical black sensor area OBS. Also, the heat spreading layer 160 may extend on the circuit area CA and the pad area PA and surround a sidewall of a connection via 170c formed in the pad area PA. However, the inventive concepts are not limited thereto. In some example embodiments, the heat spreading layer 160 may extend on the circuit area CA but not be formed on the pad area PA.

Since the heat spreading layer 160 includes a material having a high thermal conductivity, heat generated by at least one of the circuits 20 during a process of driving the circuits 20 (refer to FIG. 2) included in the circuit area CA may be uniformly or substantially uniformly distributed on the entire area of at least the active pixel sensor area APS.

In general, a row driver, a digital block, or an analog block formed in the circuit area CA may generate a relatively large amount of heat during operations so that a temperature of a portion of the substrate 110 adjacent to the circuit area CA may be relatively high. In particular, a temperature of a portion of the active pixel sensor area APS adjacent to the circuit area CA may be higher than a temperature of the remaining portion of the active pixel sensor area APS. Accordingly, in the portion of the active pixel sensor area APS adjacent to the circuit area CA, thermoelectrons may increase due to the high temperature, thereby increasing a dark current. That is, a magnitude of the dark current may vary according to point in the active pixel sensor area APS. A non-uniform distribution of dark current may occur in the active pixel sensor area APS.

In some example embodiments, since the heat spreading layer 160 is located on substantially the entire area of the active pixel sensor area APS, heat may be uniformly distributed throughout the entire area of the active pixel sensor area APS without varying temperature according to point in the active pixel sensor area APS. Accordingly, a uniform distribution of dark current may be exhibited throughout the entire area of the active pixel sensor area APS.

In some example embodiments, the heat spreading layer 160 may serve as a passivation layer configured to reduce and/or prevent moisture or contaminants from permeating into the substrate 110. For example, the heat spreading layer 160 may include a synthetic diamond layer, a graphene layer, or a DLC layer, which may be characterized by having a high hydrophobic property and a low surface energy. Accordingly, moisture or contaminants may be precluded from being attached to the heat spreading layer 160 or permeating into the substrate 110 through the heat spreading layer 160. Accordingly, it may be unnecessary to form an additional passivation (not shown) on the heat spreading layer 160. However, the inventive concepts are not limited thereto, and a passivation layer may be further formed on the heat spreading layer 160. The passivation layer may include silicon oxide or silicon nitride.

In the pad area PA, the circuit area CA, and the optical black sensor area OBS, a second insulating layer 154 may be located on the heat spreading layer 160. The second insulating layer 154 may include silicon nitride or silicon oxynitride. The second insulating layer 154 may act as an etch stop layer for forming a via hole 170H. The second insulating layer 154 may include a material having an etch selectivity with respect to materials included in the insulating interlayers 124, 134, and 144 and/or the substrate 110.

In the pad area PA, the via hole 170H may be formed through the substrate 110 and filled with the connection via 170C. Also, as shown in FIG. 4, an upper portion of the connection via 170C may be surrounded with the first insulating layer 152, the heat spreading layer 160, and the second insulating layer 154, which may be sequentially formed on the first surface 110B of the substrate 110, and a top surface of the connection via 170C may be at the same level as a top surface of the second insulating layer 154. However, the inventive concepts are not limited thereto. In some example embodiments, the first insulating layer 152 and/or the heat spreading layer 160 may not be located on the first surface 110B of the substrate 110 in the pad area PA, and only the second insulating layer 154 may be located on the first surface 110B of the substrate 110 in the pad area PA. In this case, the upper portion of the connection via 170C may be surrounded with the second insulating layer 154.

A lower portion of the connection via 170C may extend into the insulating interlayer 144 and be electrically connected to the interconnection line 146. FIG. 4 illustrates example embodiments in which a bottom surface of the connection via 170C is in contact with the interconnection line 146. However, in another case, a conductive pad (not shown) may be further formed on the interconnection line 146, and the bottom surface of the connection via 170C may be in contact with a top surface of the conductive pad.

A via insulating layer 172 may be interposed between the connection via 170C and the substrate 110 and between the connection via 170C and the insulating interlayer 144. The via insulating layer 172 may surround the sidewall of the connection via 170C and be in contact with the first insulating layer 152, the heat spreading layer 160, and the second insulating layer 154 around the first surface 110B of the substrate 110.

In the pad area PA, a conductive layer 170 may be located on the second insulating layer 154 and the connection via 170C. In some example embodiments, the conductive layer 170 may include a first metal layer and a second metal layer, which are sequentially stacked. For example, the first metal layer and the second metal layer may include different materials. The first metal layer or the second metal layer may include tungsten (W), gold (Au), silver (Ag), copper (Cu), aluminum (Al), copper tin (CuSn), copper magnesium (CuMg), copper nickel (CuNi), copper zinc (CuZn), copper palladium (CuPd), copper gold (CuAu), copper rhenium (CuRe), copper tungsten (CuW), or a combination thereof. In some example embodiments, a first conductive barrier layer and a second conductive barrier layer may be further formed on the first metal layer and the second metal layer, respectively. The first and second conductive barrier layers may include titanium (Ti), titanium nitride (TiN), tantalum (Ta), tantalum nitride (TaN), ruthenium (Ru), cobalt (Co), manganese (Mn), tungsten nitride (WN), nitride (Ni), nickel boron (NiB), or a combination thereof. The first and second conductive barrier layers may reduce and/or prevent oxidation of the first metal layer or the second metal layer or an undesired reaction of the first metal layer or the second metal layer with surrounding materials.

In some example embodiments, the connection via 170C may include a first metal layer and a second metal layer sequentially stacked on the sidewall of the via hole 170H. The first metal layer and the second metal layer may respectively include the same materials as the first metal layer and the second metal layer of the conductive layer 170, and the connection via 170C may be formed by using the same process as a process of forming the conductive layer 170. However, the inventive concepts are not limited thereto.

In the optical black sensor area OBS, a light shielding layer 174 may be formed on the second insulating layer 154. The light shielding layer 174 may be located on the entire area of the optical black sensor area OBS and extend into at least a portion of the circuit area CA or the pad area PA. The light shielding layer 174 may include a light shielding material. The light shielding layer 174 may include W, Au, Ag, Cu, Al, or a combination thereof. In some example embodiments, the light shielding layer 174 may include the same material as the first metal layer of the conductive layer 170 and be formed by using the same process as a process of forming the first metal layer of the conductive layer 170. However, the inventive concepts are not limited thereto.

A passivation layer 180 may be located on the conductive layer 170 and the light shielding layer 174. For example, the passivation layer 180 may include a combination of silicon oxide, silicon nitride, or a metal oxide.

In the pad area PA, a portion of the conductive layer 170 that is not covered with the passivation layer 180 may be referred to as a conductive pad 170P. The conductive pad 170P may be exposed outside the image sensor 100, and driving power may be supplied through the conductive pad 170P from the outside.

A color filter layer 182 may be formed on the heat spreading layer 160 in the active pixel sensor area APS of the sensor array area SA. The color filter layer 182 may include a plurality of R regions, a plurality of G regions, and a plurality of B regions.

A microlens 184 may be located on the color filter layer 182. In some example embodiments, the microlens 184 may include a TMR-based resin (a product of Tokyo Ohka Kogyo, Co.) or an MFR-based resin (a product of Japan Synthetic Rubber Corporation). In some example embodiments, individual microlenses 184 may be on separate, respective unit pixels PX.

In the image sensor 100, the heat spreading layer 160 including a material having a high thermal conductivity may be located on the entire area of the active pixel sensor area APS. Thus, heat generated during an operation of the circuit 20 in the circuit area CA may be uniformly distributed on the entire area of the active pixel sensor area APS. A partial increase of a dark current in a portion of the active pixel sensor area APS adjacent to the circuit area CA may be reduced and/or prevented, and dark shading caused by a non-uniform distribution of the dark current may be reduced and/or prevented. The image sensor 100 may provide uniform, high resolution over the entire area of the active pixel sensor area APS.

Figure 5:
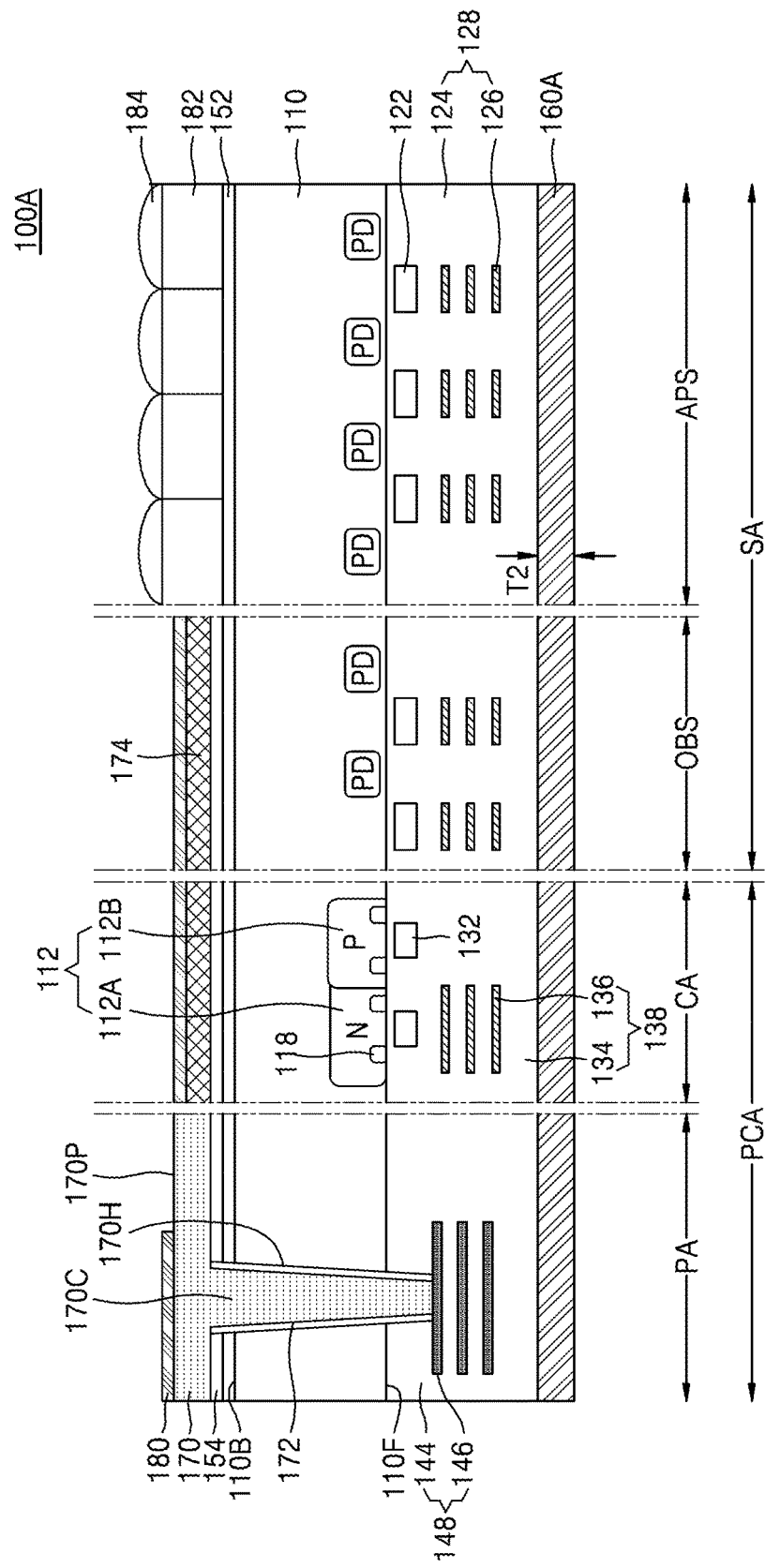
FIG. 5 is a cross-sectional view of an image sensor according to some example embodiments.

FIG. 5 is a cross-sectional view of an image sensor 100A according to some example embodiments. In FIG. 5, the same reference numerals are used to denote the same elements as in FIGS. 1 to 4, and detailed descriptions thereof are omitted for brevity.

Referring to FIG. 5, a heat spreading layer 160A may be on a second surface 110F of a substrate 110 such that multilayered interconnection structures 128, 138, and 148 are interposed between the heat spreading layer 160A and the second surface 110F of the substrate 110. The heat spreading layer 160A may be located on insulating interlayers 124, 134, and 144 of the multilayered interconnection structures 128, 138, and 148.

As shown in FIG. 5, the heat spreading layer 160A may be located on substantially the entire area of the sensor array area SA and also on the entire area of the peripheral circuit area PCA. However, the inventive concepts are not limited thereto. Unlike shown in FIG. 5, the heat spreading layer 160A may be located on substantially the entire area of the sensor array area SA and at least a portion of the peripheral circuit area PCA. For example, the heat spreading layer 160A may vertically overlap the entire top surfaces of the active pixel sensor area APS, the optical black sensor area OBS, and the circuit area CA.

In some example embodiments, the heat spreading layer 160A may include a material having a high thermal conductivity. For example, the heat spreading layer 160 may be a synthetic diamond layer, a graphene layer, or a DLC layer. The heat spreading layer 160A may have a second thickness T2 of about several tens of nm to about several micrometers (μm). When the heat spreading layer 160A has the second thickness T2 greater than the first thickness T1, heat that may be generated during operations of circuits 20 (refer to FIG. 2) included in the circuit area CA may be rapidly transmitted through the entire area of the sensor array area SA adjacent the circuits 20. Thus, non-uniform occurrence of a dark current may be reduced and/or prevented in the sensor array area SA.

Figure 6:
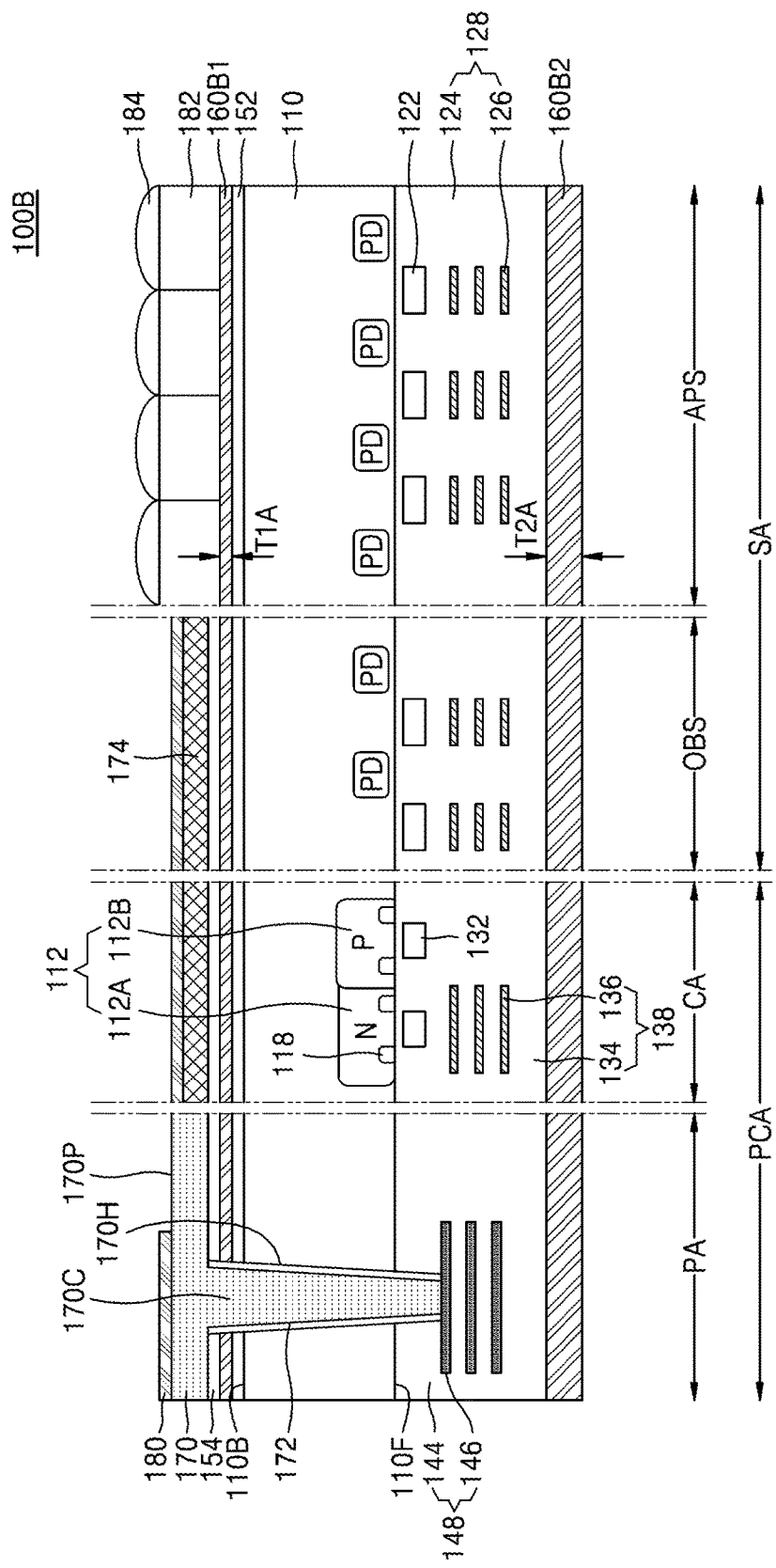
FIG. 6 is a cross-sectional view of an image sensor according to some example embodiments.

FIG. 6 is a cross-sectional view of an image sensor 100B according to some example embodiments. In FIG. 6, the same reference numerals are used to denote the same elements as in FIGS. 1 to 5, and detailed descriptions thereof are omitted for brevity.

Referring to FIG. 6, a first heat spreading layer 160B1 may be located on a first surface 110B of a substrate 110. A second heat spreading layer 160B2 may be located over a second surface 110F of the substrate 110 such that multilayered interconnection structures 128, 138, and 148 are interposed between the second heat spreading layer 160B2 and the second surface 110F of the substrate 110.

The first and second heat spreading layers 160B1 and 160B2 may respectively have similar characteristics similar to the heat spreading layers 160 and 160A described with reference to FIGS. 4 and 5.

In some example embodiments, the first heat spreading layer 160B1 may have a first thickness T1A of several tens of nm to several hundreds of nm, and the second heat spreading layer 160B2 may have a second thickness T2A of several tens of nm to several μm. For example, the second thickness T2A may be greater than the first thickness T1A.

In some example embodiments, the second thickness T2A may be equal to or less than the first thickness T1A.

Figure 7:
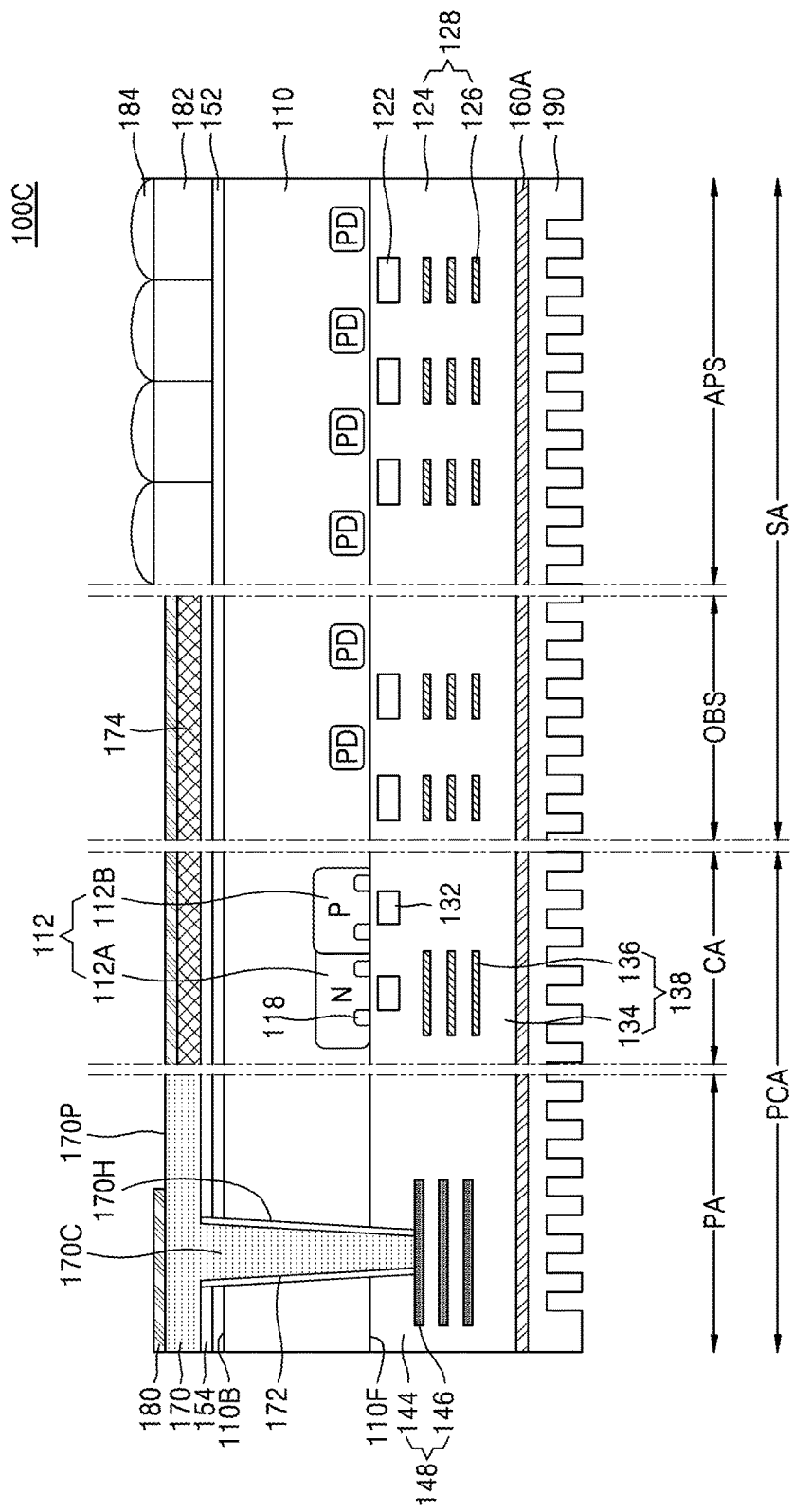
FIG. 7 is a cross-sectional view of an image sensor according to some example embodiments.

FIG. 7 is a cross-sectional view of an image sensor 100C according to some example embodiments. In FIG. 7, the same reference numerals are used to denote the same elements as in FIGS. 1 to 6, and detailed descriptions thereof are omitted for brevity.

Referring to FIG. 7, a second heat spreading layer 160A may be on a second surface 110F of a substrate 110 such that multilayered interconnection structures 128, 138, and 148 are interposed between the second heat spreading layer 160A and the second surface 110F of the second heat spreading layer 160A, and a heat radiation member 190 may be located on the second heat spreading layer 160A. The heat radiation member 190 may include a metal material having a high thermal conductivity.

Although not shown, an adhesive member (not shown) including, for example, a thermal interface material (TIM), may be interposed between the heat radiation member 190 and the second heat spreading layer 160A.

Figure 8:
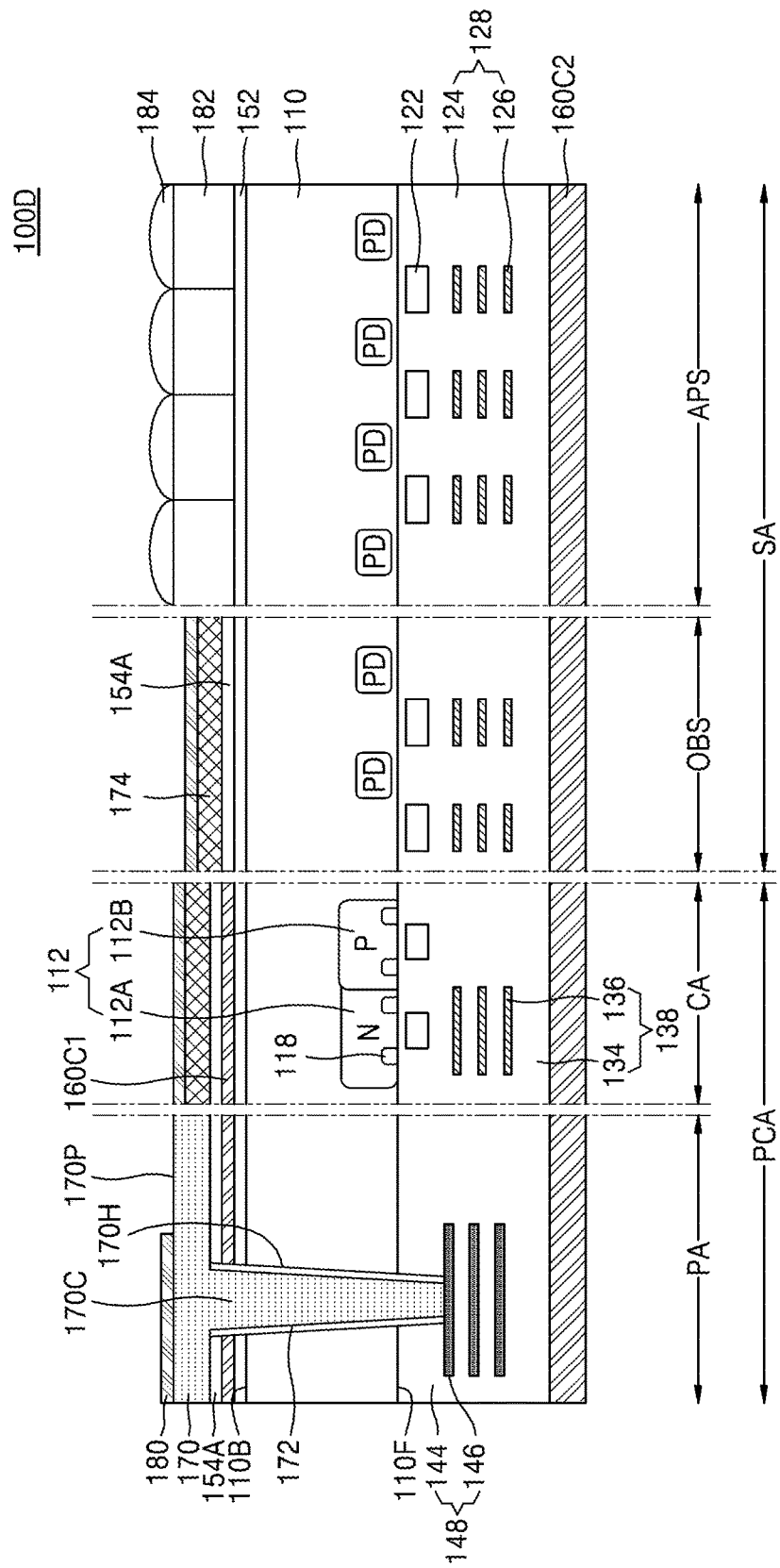
FIG. 8 is a cross-sectional view of an image sensor according to some example embodiments.

FIG. 8 is a cross-sectional view of an image sensor 100D according to some example embodiments. In FIG. 8, the same reference numerals are used to denote the same elements as in FIGS. 1 to 7, and detailed descriptions thereof are omitted for brevity.

Referring to FIG. 8, a first heat spreading layer 160C1 may be located on a first surface 110B of a substrate 110. A second heat spreading layer 160C2 may be located on a second surface 110F of the substrate 110 such that multilayered interconnection structures 128, 138, and 148 are interposed between the second heat spreading layer 160C and the second surface 110F of the substrate 110.

The first heat spreading layer 160C1 may be located on a peripheral circuit area PCA and may not be disposed on the sensor array area SA. For example, the first heat spreading layer 160C1 may vertically overlap substantially the entire area of the circuit area CA and vertically overlap at least a portion of the pad area PA.

The second heat spreading layer 160C2 may be formed in the sensor array area SA and the peripheral circuit area PCA. The second heat spreading layer 160C2 may be planarly formed on the entire second surface 110F of the substrate 110.

In the image sensors 100B, 100C, and 100D described with reference to FIGS. 6 to 8, the heat spreading layers 160A, 160B1, 160B2, 160C1, and 160C2 may be located on the first surface 110B or the second surface 110F of the substrate 110. Heat generated during operations of circuits 20 (refer to FIG. 2) included in the circuit area CA may be uniformly distributed throughout the entire area of the sensor array area SA adjacent to the circuit area CA. Thus, non-uniform generation of a dark current in the sensor array area SA may be reduced and/or prevented.

Figure 9:
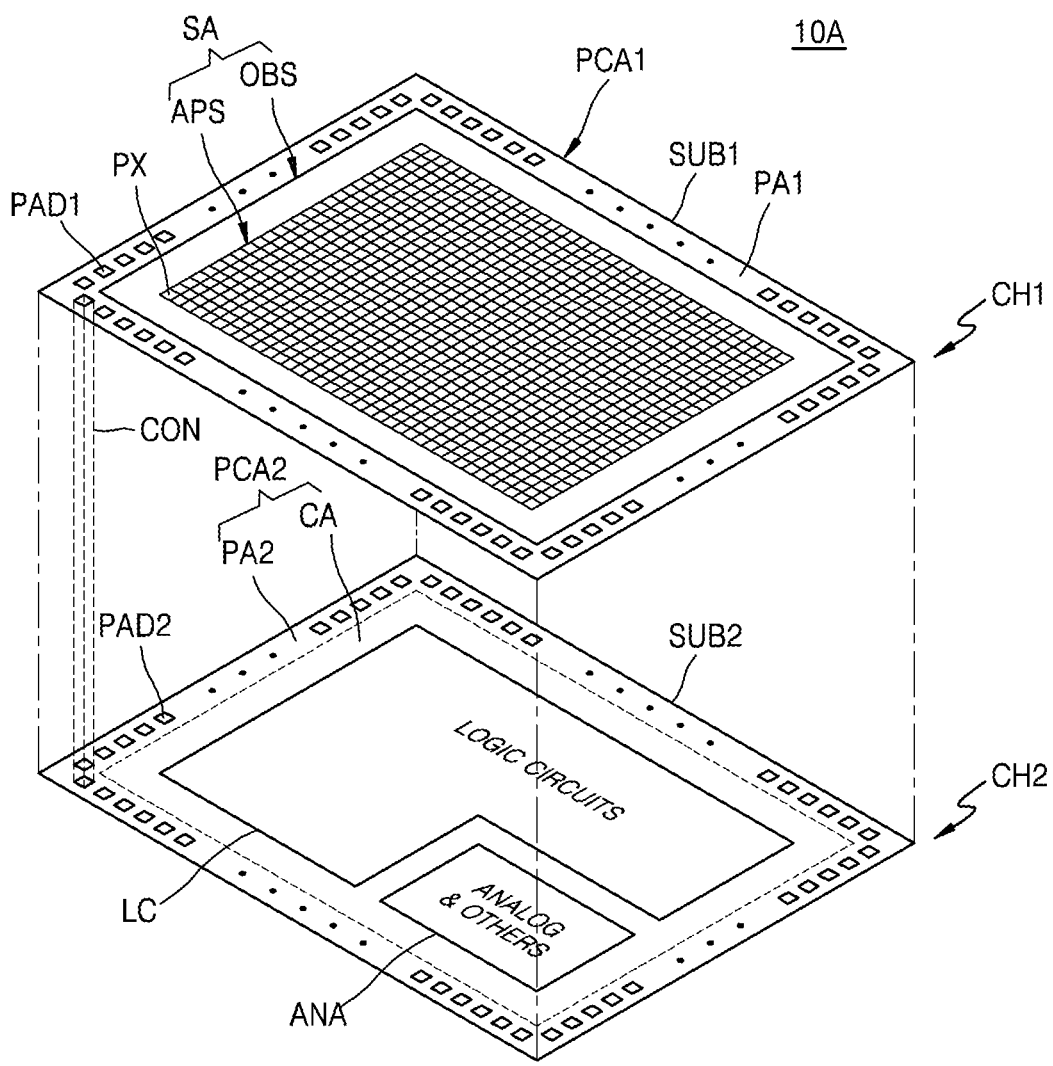
FIG. 9 illustrates a schematic layout of an image sensor according to some example embodiments.

FIG. 9 illustrates a schematic layout of an image sensor 10A according to some example embodiments. In FIG. 9, the same reference numerals are used to denote the same elements as in FIGS. 1 to 8, and detailed descriptions thereof are omitted for brevity.

Referring to FIG. 9, the image sensor 10A may be a stacked image sensor including a first chip CH1 and a second chip CH2 that are stacked in a vertical direction, such that the first chip CH1 is on the second chip CH2. The first chip CH1 may include a first substrate SUB1 including a sensor array area SA and a first peripheral circuit area PCA1. The second chip CH2 may include a second substrate SUB2 having a second peripheral circuit area PCA2.

In the first substrate SUB1, the first peripheral circuit area PCA1 may include a first pad area PA1, and the first pad area PA1 may be located around the sensor array area SA. FIG. 9 illustrates an example in which the first pad area PA1 is formed around an optical black sensor area OBS of the sensor array area SA, and a circuit area is not formed between the first pad area PA1 and the optical black sensor area OBS. However, the inventive concepts are not limited thereto. For example, a circuit area (not shown) may be formed between the first pad area PA1 and the optical black sensor area OBS, and a circuit 20 (e.g., a row decoder or a row driver) may be located in the circuit area.

In the second substrate SUB2, the second peripheral circuit area PCA2 may include a circuit area CA and a second pad area PA2 located around the circuit area CA. A logic circuit block LC and an analog block ANA may be formed in the circuit area CA.

A first pad PAD1 of the first pad area PA1 may be electrically connected to a second pad PAD2 of the second pad area PAD2 by a connection via CON.

Figure 10:
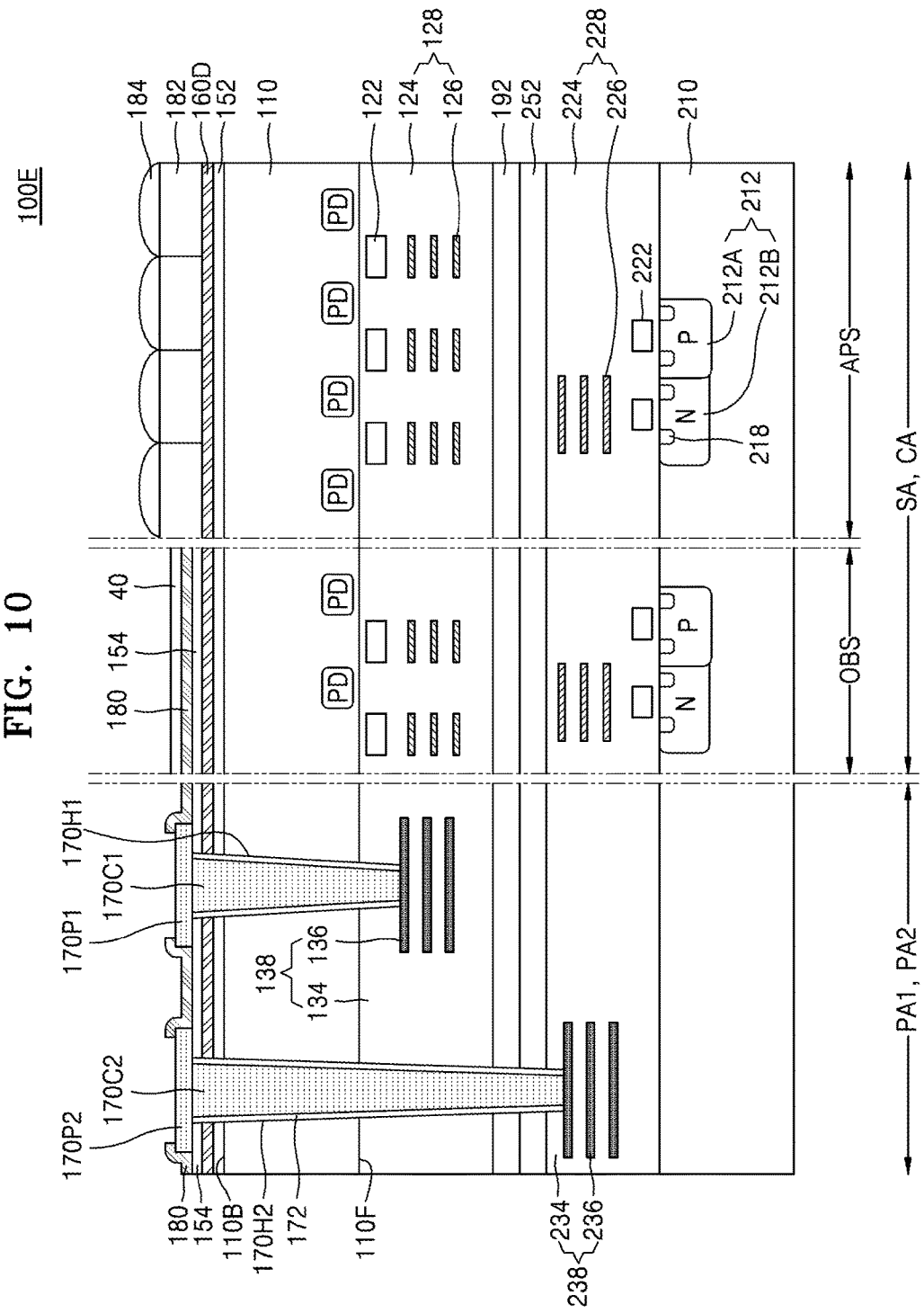
FIG. 10 is a cross-sectional view of an image sensor according to some example embodiments.

FIG. 10 is a cross-sectional view of an image sensor 100E according to some example embodiments. In FIG. 10, the same reference numerals are used to denote the same elements as in FIGS. 1 to 9, and detailed descriptions thereof are omitted for brevity.

Referring to FIG. 10, the image sensor 100E may include a stacked structure of a first substrate 110 and a second substrate 210.

The first substrate 110 may include a sensor array area SA and a first pad area PA1. The second substrate 210 may include a circuit area CA and a second pad area PA2. The circuit area CA may vertically overlap the sensor array area SA of a first substrate 110, and the first pad area PA1 may vertically overlap the second pad area PA2.

In the sensor array area SA of the first substrate 110, an active pixel sensor area APS and an optical black sensor area OBS may have technical characteristics similar to the active pixel sensor area APS and the optical black sensor area OBS described with reference to FIG. 1. In particular, a heat spreading layer 160 may be formed on a first surface 110B of the first substrate 110 in the sensor array area SA. Although not shown in FIG. 10, a light shielding layer 40 may be further formed on the optical black sensor area OBS.

Multilayered interconnection structures 128 and 138 may be formed on a second surface 110F of the first substrate 110, and a third insulating layer 192 may be formed on the multilayered interconnection structures 128 and 138. In some example embodiments, the third insulating layer 192 may include silicon oxide.

In the circuit area CA, a plurality of wells 212, which may be required to constitute a plurality of circuits LC and ANA (refer to FIG. 9), may be formed in the second substrate 210. The plurality of wells 212 may include a first-conductivity-type first well 212A and a second-conductivity-type second well 212B. In the circuit area CA, a plurality of gate electrodes 222, which may be required to constitute a plurality of circuits 20 (refer to FIG. 2), may be formed on the second substrate 210. In some embodiments, a plurality of source and drain regions 218 may be formed on both sides of the gate electrodes 222 in the plurality of wells 212. In some embodiments, the plurality of source and drain regions 218 may constitute transistors along with the gate electrodes 222.

In the circuit area CA, a multilayered interconnection structure 228 may be formed on the second substrate 210. The multilayered interconnection structure 228 may include an insulating interlayer 224 and a plurality of interconnection lines 226. Among the interconnection lines 226, adjacent interconnection lines 226 may be insulated from one another by the insulating interlayer 224.

In the second pad area PA2, a multilayered interconnection structure 238 may be formed on the second substrate 210. The multilayered interconnection structure 238 may include an insulating interlayer 234 and a plurality of interconnection lines 236. Among the interconnection lines 236, adjacent interconnection lines 236 may be insulated from one another by the insulating interlayer 234.

In the circuit area CA and the second pad area PA2, a fourth insulating layer 252 may be formed on the multilayered interconnection structures 228 and 238. In some example embodiments, the fourth insulating layer 252 may be adhered to the third insulating layer 192. For example, the fourth insulating layer 252 may be adhered to the third insulating layer 192 by an oxide-oxide direct bonding method. In some example embodiments, an adhesive member (not shown) may be interposed between the fourth insulating layer 252 and the third insulating layer 192.

In the first pad area PA1 of the first substrate 110, a first via hole 170H1 and a second via hole 170H2 may be formed through the first substrate 110. The first via hole 170H1 and the second via hole 170H2 may be filled with a first connection via 170C1 and a second connection via 170C2, respectively.

The first connection via 170C1 may penetrate the first substrate 110 and extend into the insulating interlayer 134 and be electrically connected to an interconnection line 136 of the multilayered interconnection structure 138. A first conductive pad 170P1 may be formed on the first connection via 170C1.

The second connection via 170C2 may penetrate the first substrate 110, the insulating interlayer 134, and the third and fourth insulating layers 192 and 252 and extend into the insulating interlayer 234 and be electrically connected to the interconnection lines 236 of the multilayered interconnection structure 238. A first conductive pad 170P2 may be formed on the second connection via 170C2.

The active pixel sensor area APS of the first substrate 110 may be electrically connected to the circuit area CA of the second substrate 210 by the first and second connection vias 170C1 and 170C2.

FIG. 10 illustrates an example embodiment in which the first substrate 110 and the second substrate 210 are electrically connected to each other by the connection vias 170C1 and 170C2 formed through the first substrate 110, but the inventive concepts are not limited thereto. Unlike shown in FIG. 10, a first connection pad (not shown) and a second connection pad (not shown) formed in the first substrate 110 and the second substrate 210, respectively, may be adhered to each other by a direct bonding method so that the first substrate 110 may be electrically connected to the second substrate 210. In some example embodiments, the first connection pad (not shown) and the second connection pad (not shown) formed in the first substrate 110 and the second substrate 210, respectively, may be connected to each other by bonding wires (not shown) so that the first substrate 110 may be electrically connected to the second substrate 210.

A heat spreading layer 160D may be formed on the active pixel sensor area APS, the optical black sensor area OBS, and the first pad area PA1. In the first pad area PA1, the heat spreading layer 160D may surround sidewalls of the first and second connection vias 170C1 and 170C2.

The image sensor 100E may be a stacked image sensor including the first substrate 110 and the second substrate 210 that are stacked in a vertical direction. The active pixel sensor area APS may be formed on the first substrate 110, the circuit area CA may be formed on the second substrate 210, and the active pixel sensor area APS and the circuit area CA may be electrically connected to each other by the second connection via 170CA, which may penetrate the first substrate 110 and extend into the second substrate 210. In the image sensor 100E, since the first and second substrates 110 and 210 are formed in the active pixel sensor area APS and the circuit area CA, respectively, the active pixel sensor area APS and the circuit area CA may be manufactured under process conditions that are optimized for performances of the active pixel sensor area APS and the circuit area CA. Thus, the image sensor 100E may have excellent performance.

In addition, since the heat spreading layer 160D is formed on substantially the entire area of the active pixel sensor area APS, heat generated during operations of the circuits LC and ANA included in the circuit area CA of the second substrate 210 may be uniformly distributed on the entire area of the active pixel sensor area APS. Accordingly, the image sensor 110E may reduce and/or prevent non-uniform occurrence of a dark current and dark shading caused by the non-uniform dark current.

Figure 11:
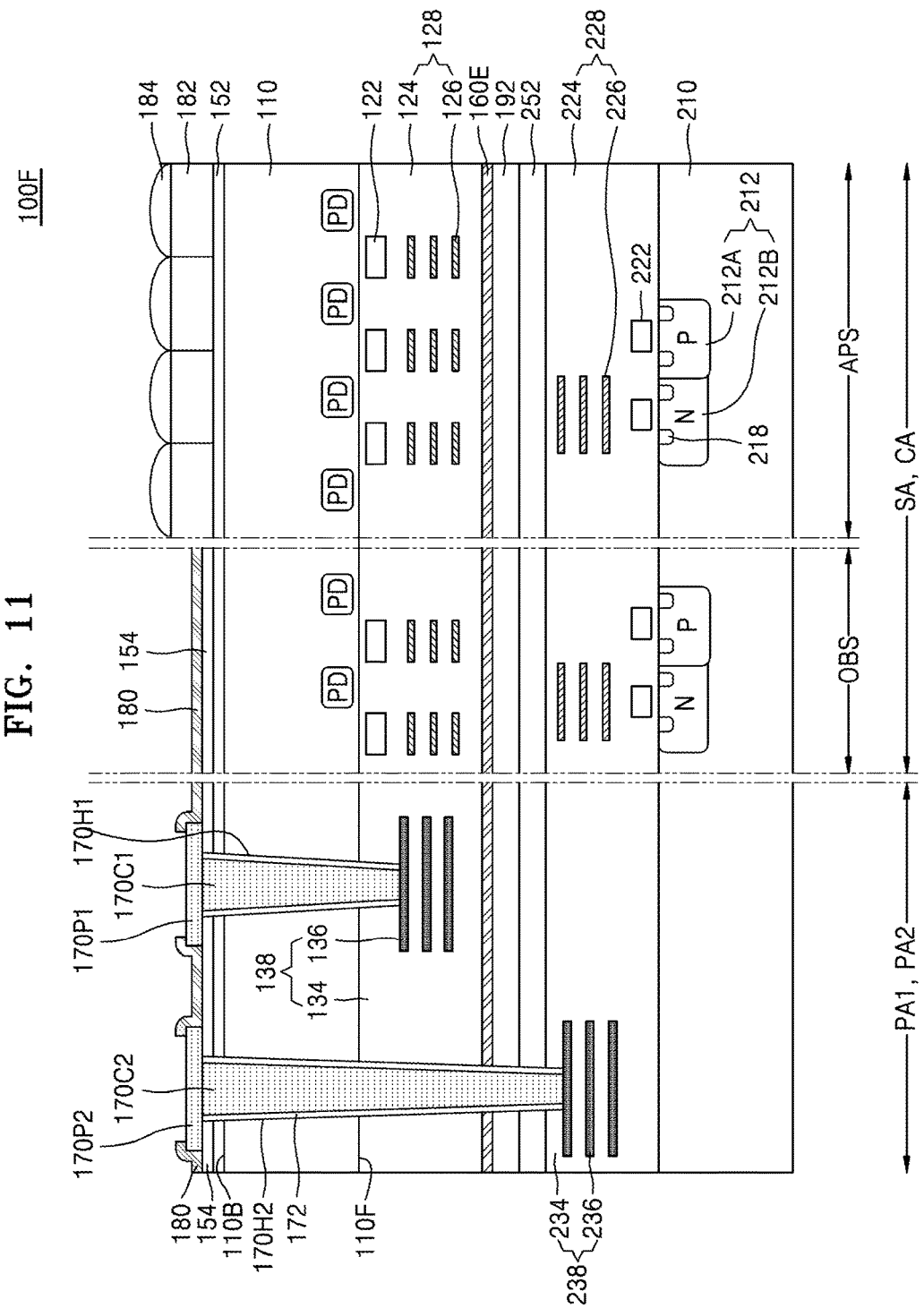
FIG. 11 is a cross-sectional view of an image sensor according to some example embodiments.

FIG. 11 is a cross-sectional view of an image sensor 100F according to some example embodiments. In FIG. 11, the same reference numerals are used to denote the same elements as in FIGS. 1 to 10, and detailed descriptions thereof are omitted for brevity.

Referring to FIG. 11, a heat spreading layer 160E may be formed over a second surface 110F of a first substrate 110 so that a multilayered interconnection structure 128 may be interposed between the heat spreading layer 160E and the second surface 110F of the first substrate 110. The heat spreading layer 160E may be formed on insulating interlayers 124 and 134, and a third insulating layer 192 may be formed on the heat spreading layer 160E. In a first pad area PA1, the heat spreading layer 160E may surround a sidewall of a second connection via 170C2.

In the image sensor 100F, the heat spreading layer 160E may be interposed between the first substrate 110 and a second substrate 210. Heat generated during operations of circuits LC and ANA (refer to FIG. 9) included in a circuit area CA of the second substrate 210 may be uniformly distributed on the entire area of the active pixel sensor area APS.

Furthermore, heat generated during the operations of the circuits LC and ANA may be rapidly transmitted by the heat spreading layer 160F out of the image sensor 100F. Thus, the amount of heat transmitted from the circuit area CA into the active pixel sensor area APS of the first substrate 110 may be reduced so that a dark current of the active pixel sensor area APS may be considerably reduced. The image sensor 100F may reduce and/or prevent non-uniform occurrence of a dark current and dark shading caused by the non-uniform dark current. The image sensor 100F may reduce the occurrence of the dark current.

Figure 12:
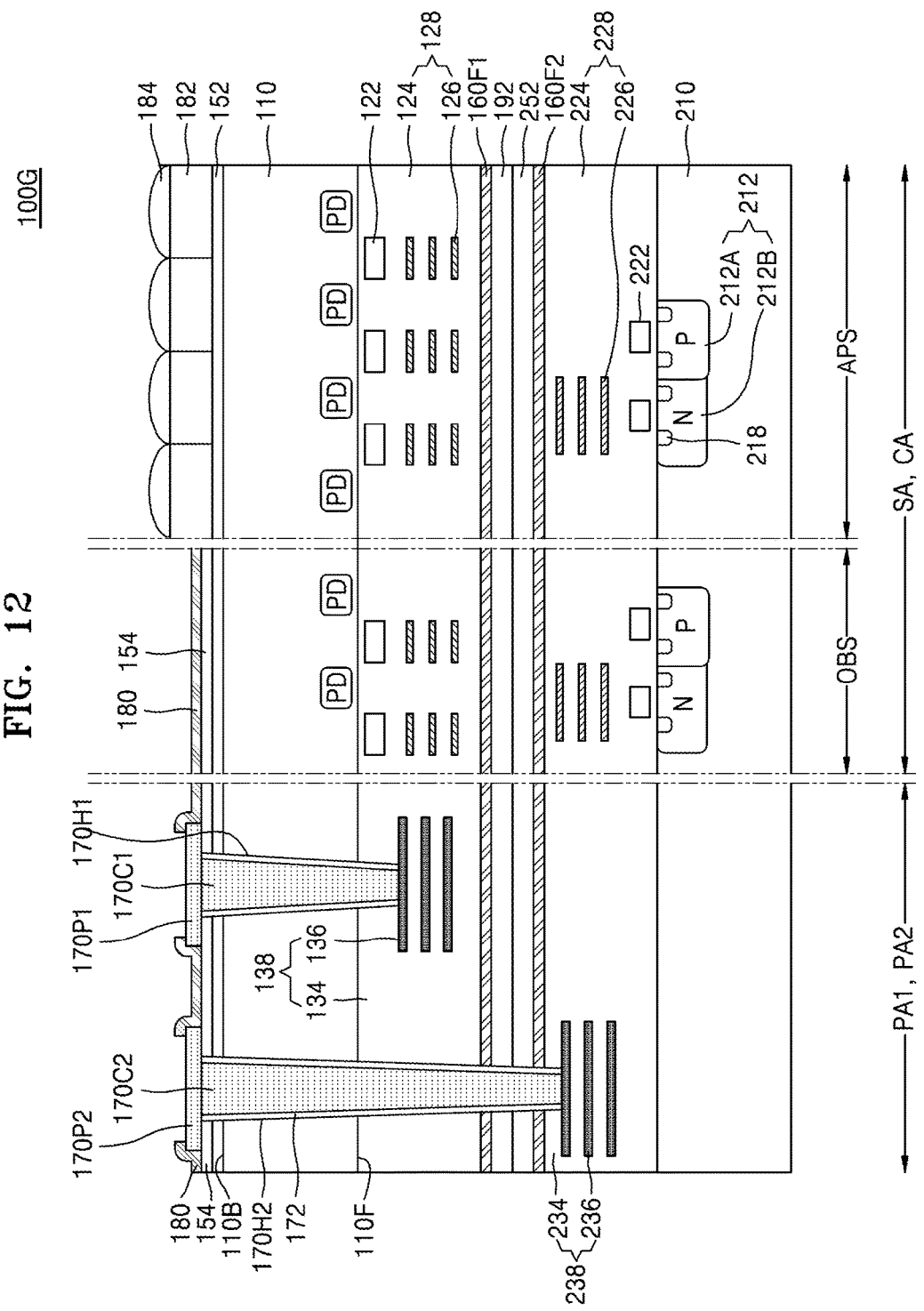
FIG. 12 is a cross-sectional view of an image sensor according to some example embodiments.

FIG. 12 is a cross-sectional view of an image sensor 100G according to some example embodiments. In FIG. 12, the same reference numerals are used to denote the same elements as in FIGS. 1 to 11, and detailed descriptions thereof are omitted for brevity.

Referring to FIG. 12, a first heat spreading layer 160F1 may be formed on insulating interlayers 128 and 138 over a second surface 110F of a first substrate 110, and a third insulating layer 192 may be formed on the first heat spreading layer 160F1. Also, a second heat spreading layer 160F2 may be formed on insulating interlayers 224 and 234 over a second substrate 210, and a fourth insulating layer 252 may be formed on the second heat spreading layer 160F2. The first and second heat spreading layers 160F1 and 160F2 may be formed on the entire areas of the first and second substrates 110 and 210 and surround a sidewall of a second connection via 170C2. However, the inventive concepts are not limited thereto.

Although not shown, at least one of the first and second heat spreading layers 160F1 and 160F2 may be connected to a heat radiation structure (not shown) adhered to an image sensor module (not shown) including the image sensor 100G. For example, the heat radiation structure may include various kinds of heat radiation members, such as a heat radiation sheet, a ceramic heat radiation plate, and a metal heat sink. Also, at least one of the first and second heat spreading layers 160F1 and 160F2 may be connected to the heat radiation structure by using a wire bonding method or an adhesive member, such as a thermal interface material (TIM).

In the image sensor 100G, since the first and second heat spreading layers 160F1 and 160F2 are located between the first substrate 110 and the second substrate 210, heat generated during operations of circuits LC and ANA (refer to FIG. 9) included in a circuit area CA of the second substrate 210 may be uniformly distributed on the entire area of an active pixel sensor area APS. Also, the amount of heat transmitted from the circuit area CA into the active pixel sensor area APS of the first substrate 110 may be reduced, so that a dark current of the active pixel sensor area APS may be considerably reduced. The image sensor 100G may reduce and/or prevent non-uniform occurrence of a dark current and dark shading caused by the non-uniform dark current. The image sensor 100G may reduce the occurrence of the dark current.

Figure 13:
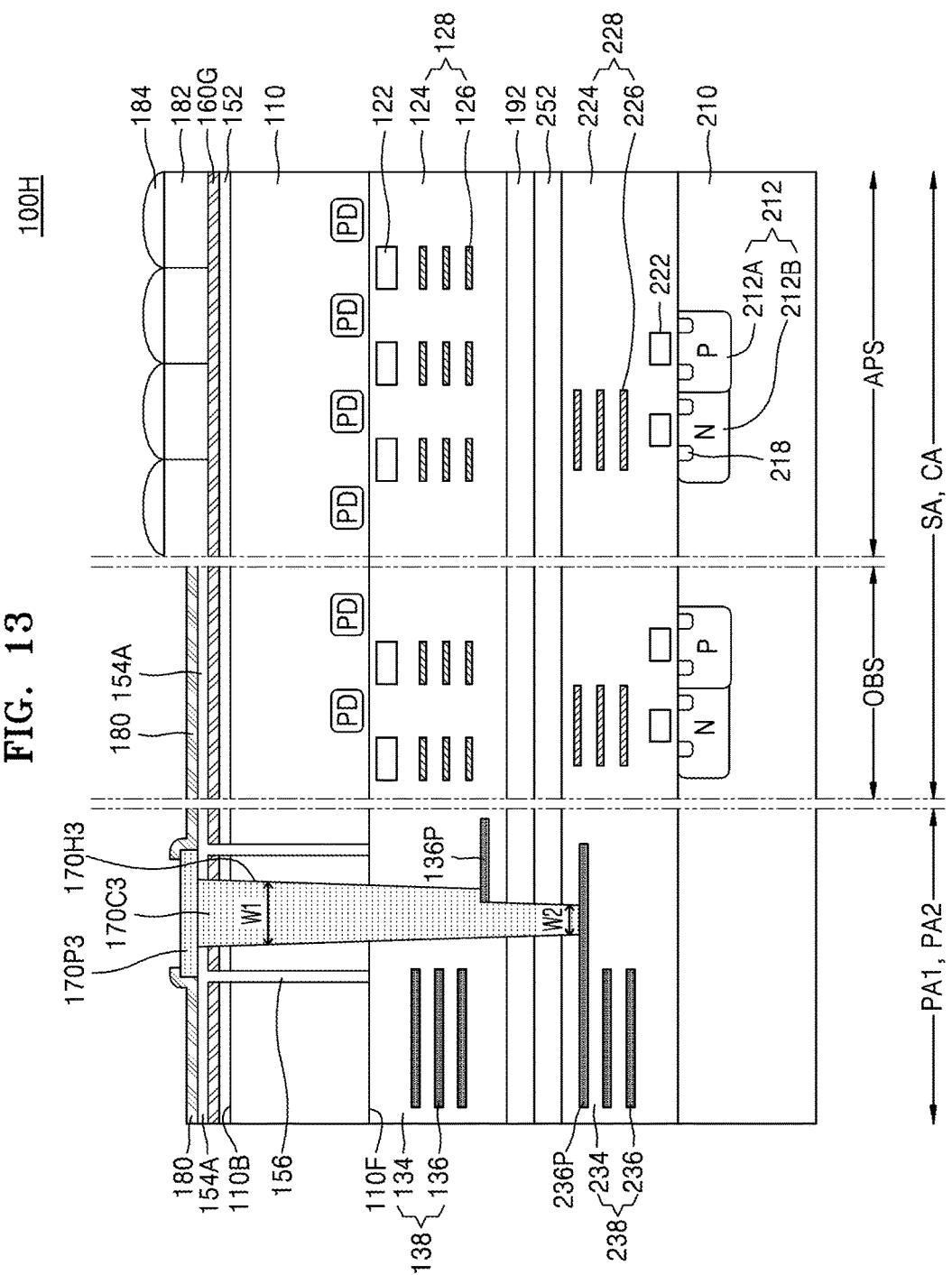
FIG. 13 is a cross-sectional view of an image sensor according to some example embodiments.

FIG. 13 is a cross-sectional view of an image sensor 100H according to some example embodiments. In FIG. 13, the same reference numerals are used to denote the same elements as in FIGS. 1 to 12, and detailed descriptions thereof are omitted for brevity.

Referring to FIG. 13, a connection via 170C3 may be formed in first and second pad areas PA1 and PA2. An active pixel sensor area APS of a first substrate 110 may be electrically connected to a circuit area CA of a second substrate 210 by the connection via 170C3.

A first landing pad 136P may be formed in an insulating interlayer 134 of a multilayered interconnection structure 138, and a second landing pad 236P may be formed in an insulating interlayer 234 of a multilayered interconnection structure 238. A portion of the second landing pad 236P may overlap the first landing pad 136P in a vertical direction (e.g., in a vertical direction to a top surface of the first substrate 110). The first and second landing pads 136P and 236P may be formed at the same level as the interconnection lines 136 and 236 or at a different level from the interconnection lines 136 and 236. The first and second landing pads 136P and 236P may include the same material as the interconnection lines 136 and 236, but the inventive concepts are not limited thereto.

In the first pad area PA1 of the first substrate 110, a via hole 170H3 may be formed through the first substrate 110, and a bottom portion of the via hole 170H3 may extend to a portion of the multilayered interconnection structure 238 formed on the second substrate 210. The via hole 170H3 may expose a portion of a top surface of the first landing pad 136P, and a portion of a top surface of the second landing pad 236P may be exposed by the bottom portion of the via hole 170H3. An upper portion of the via hole 170H3 may have a first width W1, and a lower portion of the via hole 170H3 may have a second width W2 less than the first width W1. Here, the upper portion of the via hole 170H3 may refer to a portion of the via hole 170H3 located at a higher level than the first landing pad 136P. The lower portion of the via hole 170H3 may refer to a portion of the via hole 170H3 located at a lower level than the first landing pad 136P. Thus, a portion of the via hole 170H3 located at the same level as the multilayered interconnection structure 238 formed on the second substrate 210 may have the second width W2 less than the first width W1.

The via hole 170H3 may be filled with the connection via 170C3. The connection via 170C3 may be in contact with the top surface of the first landing pad 136P exposed by the via hole 170H3. Also, the connection via 170C3 may be in contact with the top surface of the second landing pad 236P exposed by the bottom portion of the via hole 170H3. Thus, the connection via 170C3 may be electrically connected to the first and second landing pads 136P and 236P.

A conductive pad 170P3 may be formed on the connection via 170C3.

A heat spreading layer 160G may be formed on a first surface 110B of the first substrate 110. In the first pad area PA1, the heat spreading layer 160G may surround a sidewall of the connection via 170C3.

A second insulating layer 154A may be formed on the heat spreading layer 160G. A via separation layer 156 may be located around the via hole 170H3 and penetrate the first substrate 110. The second insulating layer 154A may include the same material as the via separation layer 156. However, the inventive concepts are not limited thereto.

FIG. 13 illustrates an example in which the via separation layer 156 penetrates the first substrate 110, the first insulating layer 152, and the heat spreading layer 160G. However, in another case, the via separation layer 156 may penetrate only the first substrate 110 and the first insulating layer 152, and the heat spreading layer 160G may be located on the first insulating layer 152 and the via separation layer 156. Also, the via separation layer 156 may penetrate only the first substrate 110, and the first insulating layer 152 may be located on the first substrate 110 and the via separation layer 156.

Figure 14:
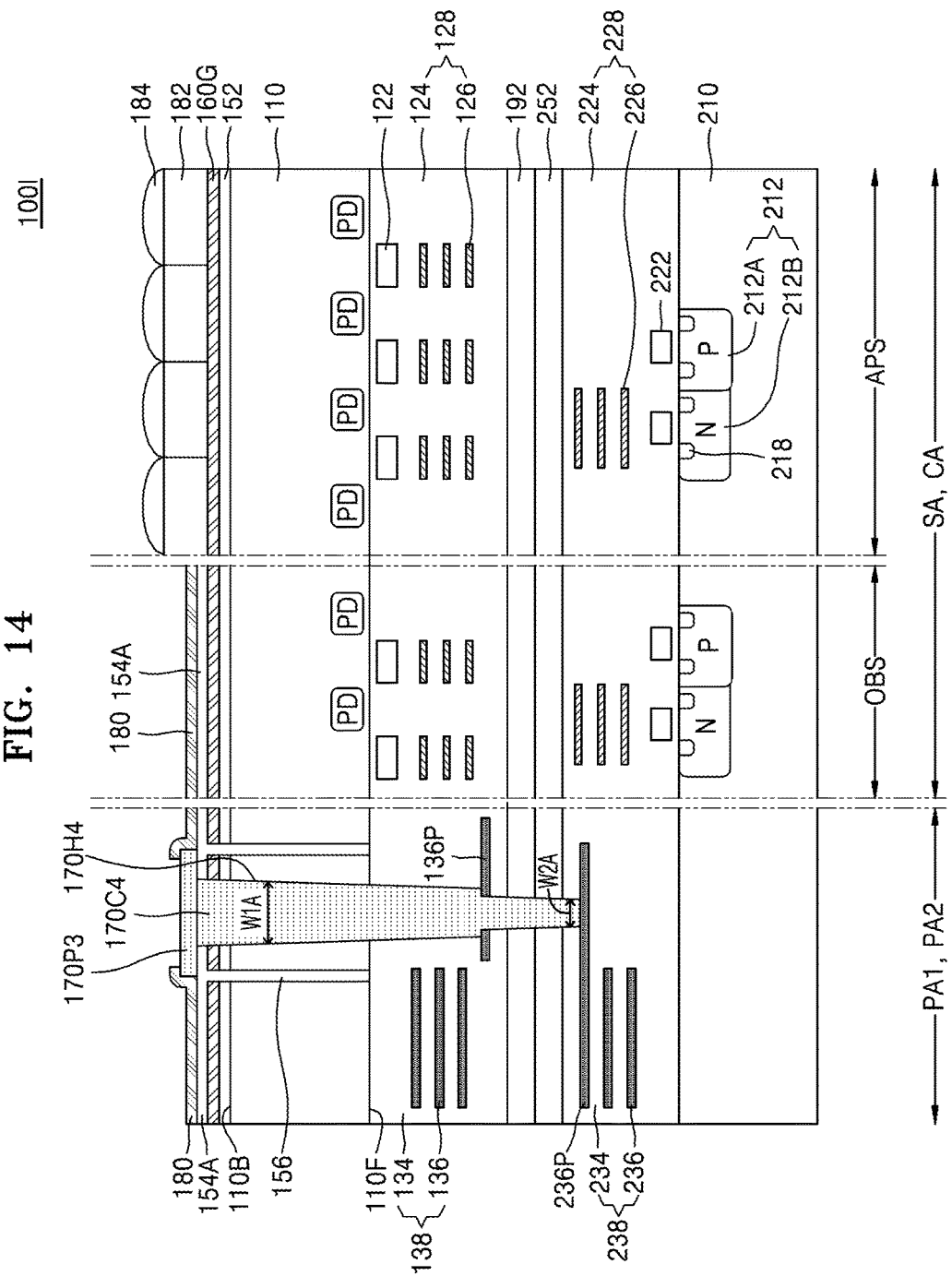
FIG. 14 is a cross-sectional view of an image sensor according to some example embodiments.

FIG. 14 is a cross-sectional view of an image sensor 100I according to some example embodiments. In FIG. 14, the same reference numerals are used to denote the same elements as in FIGS. 1 to 13, and detailed descriptions thereof are omitted for brevity.

Referring to FIG. 14, a via hole 170H4 may penetrate (e.g., "extend through") a central portion of a first landing pad 136P. Thus, a connection via 170C4 may penetrate the central portion of the first landing pad 136P, and the first landing pad 136P may surround a sidewall of the connection via 170C4.

A portion of the via hole 170H4 located at a higher level than the first landing pad 136P may have a first width W1A. A portion of the via hole 170H4 located at a lower level than the first landing pad 136P may have a second width W2A less than the first width W1A.

FIG. 15, FIG. 16, FIG. 17, FIG. 18, FIG. 19, FIG. 20, FIG. 21, and FIG. 22 are cross-sectional views of a method of manufacturing an image sensor according to some example embodiments. The method may be the method of manufacturing the image sensor 100E as described above with reference to FIG. 10.

Figure 15:
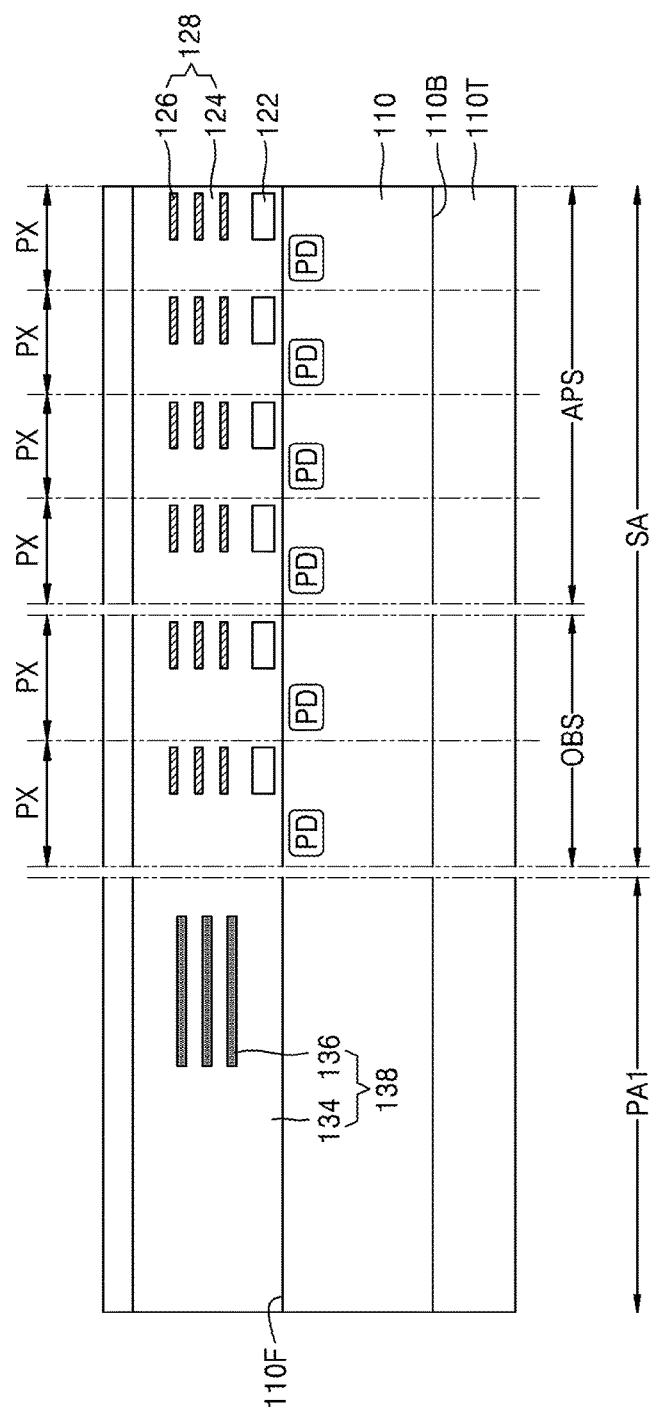
FIG. 15, FIG. 16, FIG. 17, FIG. 18, FIG. 19, FIG. 20, FIG. 21, and FIG. 22 are cross-sectional views of a method of manufacturing an image sensor according to some example embodiments.

Referring to FIG. 15, a semiconductor epi layer may be grown on a semiconductor substrate 110T to form a first substrate 110 including the epi layer. A sensor array area SA (refer to FIG. 9) and a first pad region PA1 may be defined in the first substrate 110. The sensor array area SA may include an active pixel sensor area APS and an optical black sensor area OBS.

In the sensor array area SA, a plurality of unit pixels PX (refer to FIG. 9) may be formed in the first substrate 110. The formation of the plurality of unit pixels PX may include forming photoelectric conversion regions (e.g., photodiodes PD). The formation of the plurality of unit pixels PX may include forming a plurality of impurity diffusion regions (not shown) in the sensor array area SA of the first substrate 110. The formation of the plurality of unit pixels PX may include forming a plurality of gate electrodes 122 on a first surface 110F of the first substrate 110.

Thereafter, the front surface 110F of the first substrate 110 may be covered with an insulating interlayer 124 in the sensor array area SA, and a multilayered interconnection structure 128 may be formed in the sensor array area SA. The multilayered interconnection structure 128 may include a plurality of interconnection lines 126, and at least portions of the interconnection lines 126 of the multilayered interconnection structure 128 may be insulated by the insulating interlayer 124. During the formation of the multilayered interconnection structure 128 in the sensor array area SA, an insulating interlayer 134 and a multilayered interconnection structure 138 may be formed in the first pad area PA1. The multilayered interconnection structure 138 may include a plurality of interconnection lines 136, and at least portions of the interconnection lines 136 of the multilayered interconnection structure 138 may be insulated by the insulating interlayer 134.

In some example embodiments, each of the insulating interlayers 124 and 134 may include a plurality of layers. In the sensor array area SA and the first pad area PA1, layers formed at the same level from among the plurality of interconnection lines 126 and the plurality of interconnection lines 136 may be formed during the same process.

In some example embodiments, the insulating interlayers 124 and 134 may include at least one material selected from the group consisting of a flowable oxide (FOX), a high-density plasma (HDP) oxide, tonen silazene (TOSZ), spin-on glass (SOG), or undoped silica glass (USG).

A third insulating layer 192 may be formed to a desired (or, alternatively, predetermined) thickness on the insulating interlayers 124 and 134. The third insulating layer 192 may include silicon oxide. The third insulating layer 192 may include, for example, at least one material selected from the group consisting of FOX, an HDP oxide, TOSZ, SOG, or USG.

Figure 16:
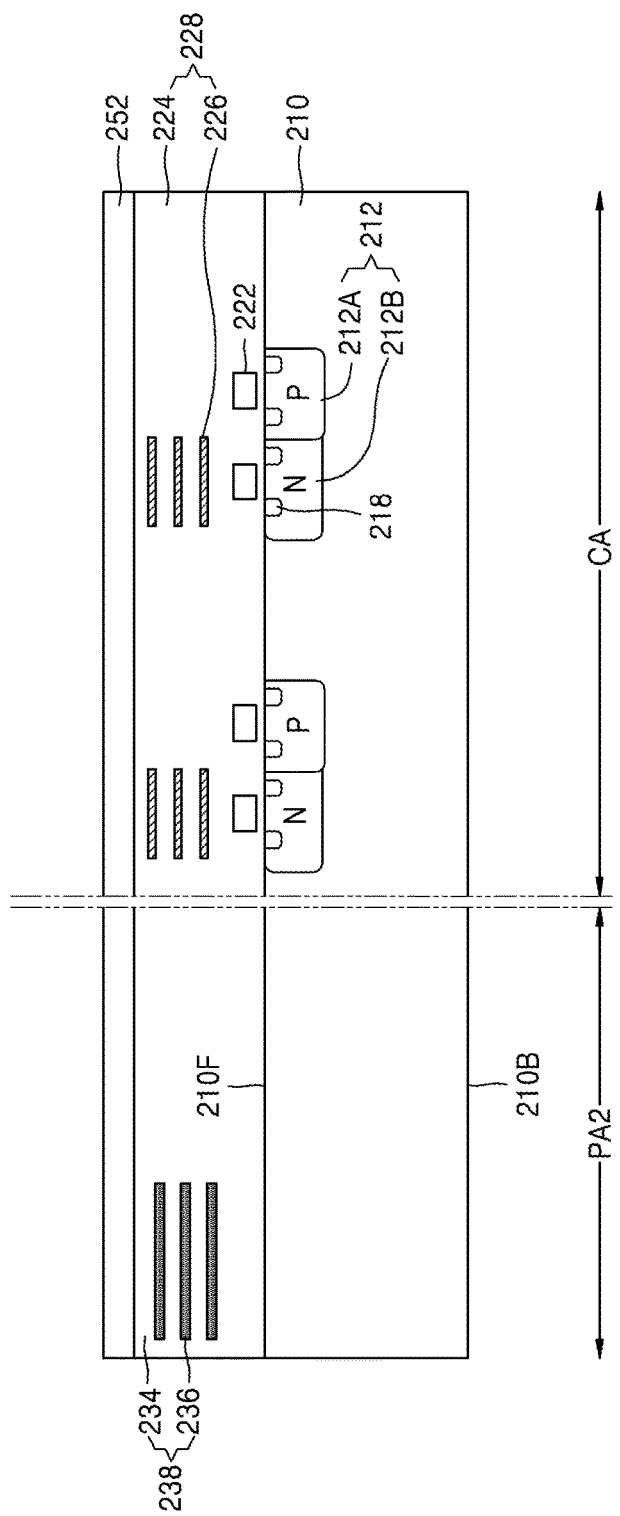

Referring to FIG. 16, a second substrate 210 including a circuit area CA and a second pad area PA2 may be prepared.

In the circuit area CA, a plurality of wells 212, which may be required to constitute the plurality of circuits LC and ANA (refer to FIG. 9), may be formed in the second substrate 210. The plurality of wells 212 may include a first-conductivity-type first well 212A and a second-conductivity-type second well 212B. A plurality of gate electrodes 222, which may be required to constitute the plurality of circuits 20 (refer to FIG. 2), may be formed on the second substrate 210. Also, a plurality of source and drain regions 218 may be formed on both sides of the gate electrodes 122 in the plurality of wells 212.

In the circuit area CA, a plurality of interconnection lines 226 may be formed on the second substrate 210, and an insulating interlayer 224 may be formed to cover the plurality of interconnection lines 226. The plurality of interconnection lines 226 and the insulating interlayer 224 may be referred to as a multilayered interconnection structure 228. During a process of forming the plurality of interconnection lines 226 and the insulating interlayer 224, a plurality of interconnection lines 236 and an insulating interlayer 234 may also be formed in the second pad area PA2.

In some embodiments, the insulating interlayers 224 and 234 may include at least one material selected from the group consisting of a FOX, an HDP oxide, TOSZ, SOG, or USG.

A fourth insulating layer 252 may be formed to a desired (or, alternatively, predetermined) thickness on the insulating interlayers 224 and 234. The fourth insulating layer 252 may include silicon oxide. The fourth insulating layer 252 may include, for example, at least one material selected from the group consisting of FOX, an HDP oxide, TOSZ, SOG, or USG.

Figure 17:
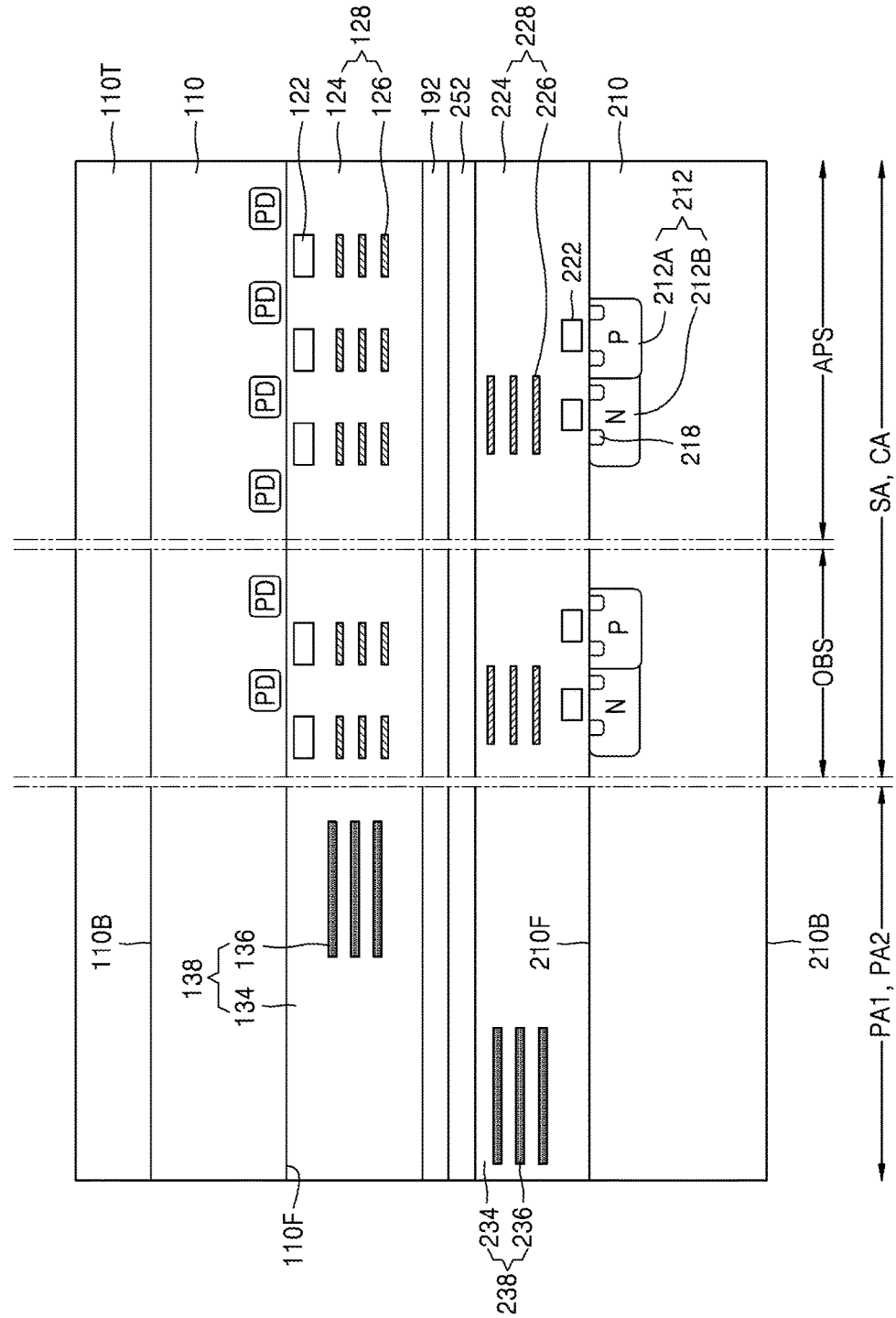

Referring to FIG. 17, the first substrate 110 may be adhered onto the second substrate 210 such that the front surface 110F of the first substrate 110 faces the front surface 210F of the second substrate 210.

In an exemplary process of adhering the first substrate 110 onto the second substrate 210, the first substrate 110 and the second substrate 210 may be located such that a top surface of the third insulating layer 192 of the first substrate 110 is in contact with a top surface of the fourth insulating layer 252 of the second substrate 210. The third insulating layer 192 may be adhered to the fourth insulating layer 252 by using an oxide-oxide direct bonding method.

Optionally, before the adhesion process, a pre-processing process or a thermal process may be performed on the surfaces of the third insulating layer 192 and the fourth insulating layer 252. Also, during the adhesion process, a thermal process may be performed on the first substrate 110 and the second substrate 210 while the top surface of the third insulating layer 192 is in contact with the top surface of the fourth insulating layer 252. For example, the thermal process may be performed at a temperature of about 100° C. to about 400° C., but the inventive concepts is not limited thereto.

Figure 18:
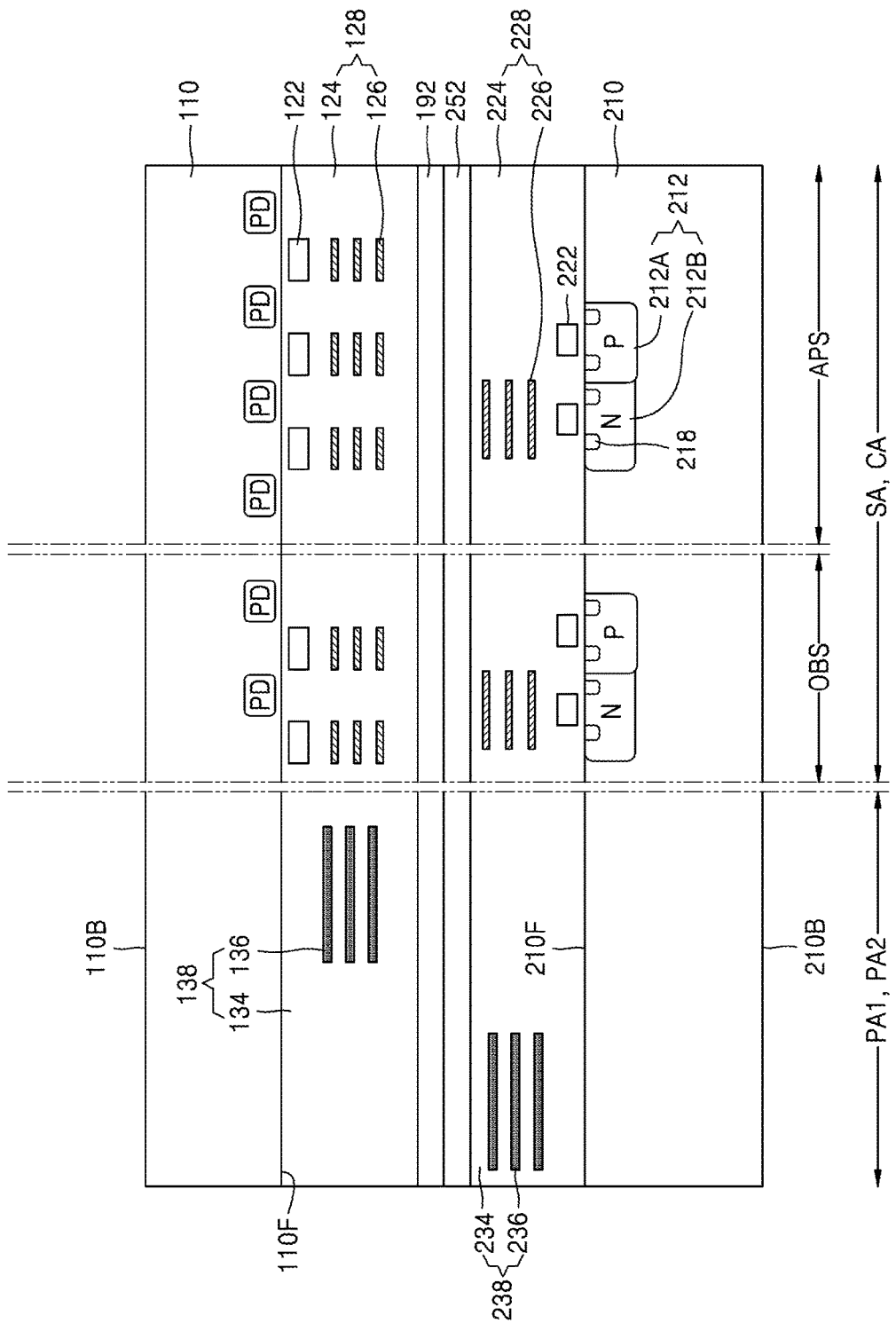

Referring to FIG. 18, a back surface 110B of the first substrate 110 may be exposed by removing the semiconductor substrate 110T. In some embodiments, the semiconductor substrate 110T may be removed by using at least one process of a chemical mechanical polishing (CMP) process, a back grinding (BGR) process, or a reactive ion etching (RIE) process. In some example embodiments, the exposed back surface 110B of the first substrate 110 may be processed with hydrogen plasma to cure defects (e.g., dangling bonds) on the first substrate 110. The back surface 110B may be referred to as the "first surface 110B" of the first substrate 110, and the front surface 110F may be referred to as the "second surface 110F" of the first substrate 110.

Figure 19:
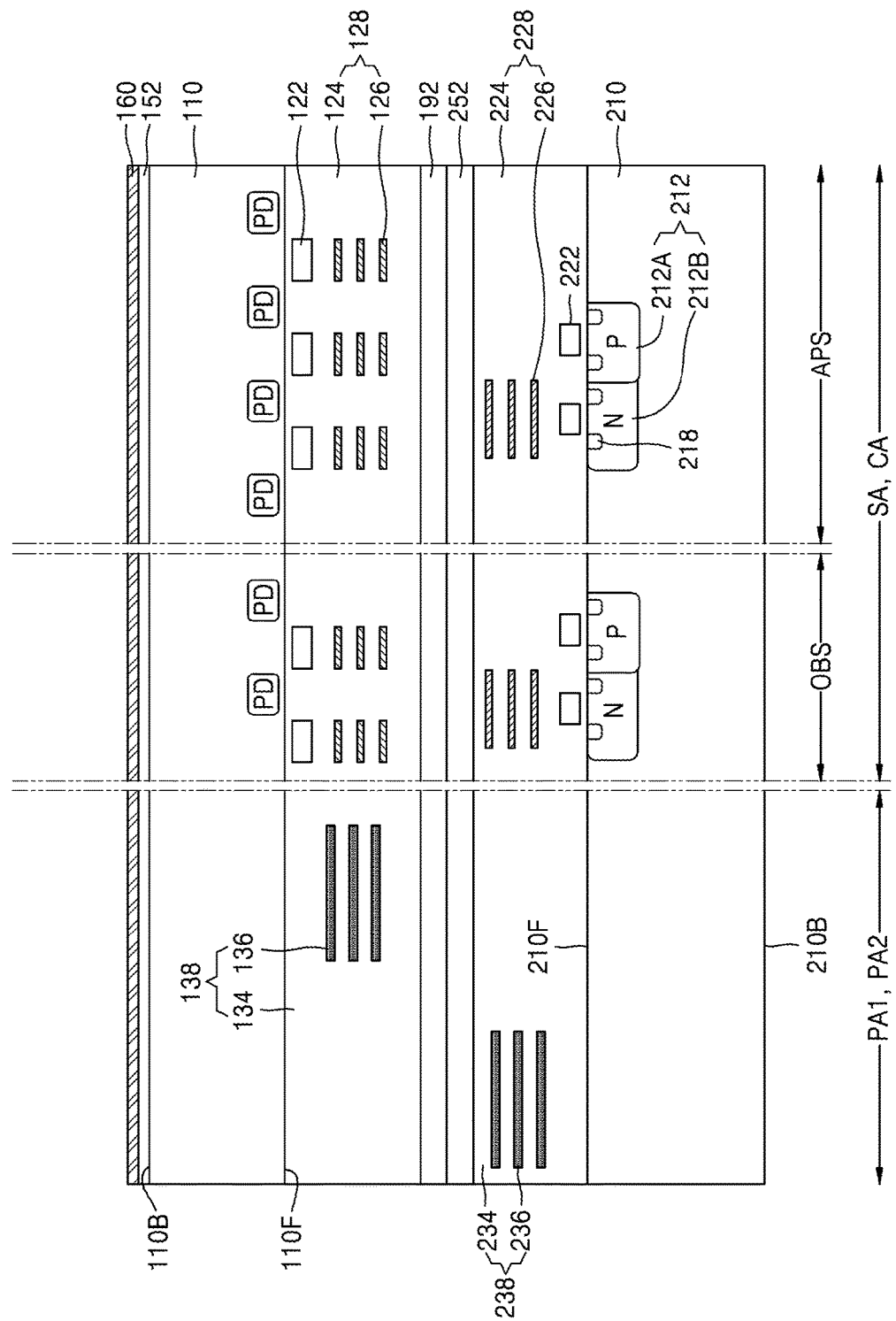

Referring to FIG. 19, a first insulating layer 152 may be formed on the second surface 110B of the first substrate 110. The first insulating layer 152 may include a metal oxide, such as hafnium oxide (HfOx) or aluminum oxide (AlOx). The first insulating layer 152 may include a metal oxide or metal oxynitride having negative fixed charges so that a charge accumulation layer may be formed at an interface between the first insulating layer 152 and the first substrate 110.

Thereafter, a heat spreading layer 160 may be formed on the first insulating layer 152. The heat spreading layer 160 may include a synthetic diamond layer, a graphene layer, or a DLC layer. For example, the heat spreading layer 160 may be formed by using a CVD process, a plasma-enhanced CVD (PECVD) process, a physical vapor deposition (PVD)

process, an atomic layer deposition (ALD) process, a vacuum arc deposition process, or a chemical exfoliation process.

In some example embodiments, the heat spreading layer 160 may be formed using synthetic diamond by using a CVD process at a temperature of, for example, about 100° C. to about 400° C.

In some example embodiments, the heat spreading layer 160 may be formed using graphene by means of a CVD process or a chemical exfoliation process.

Figure 20:
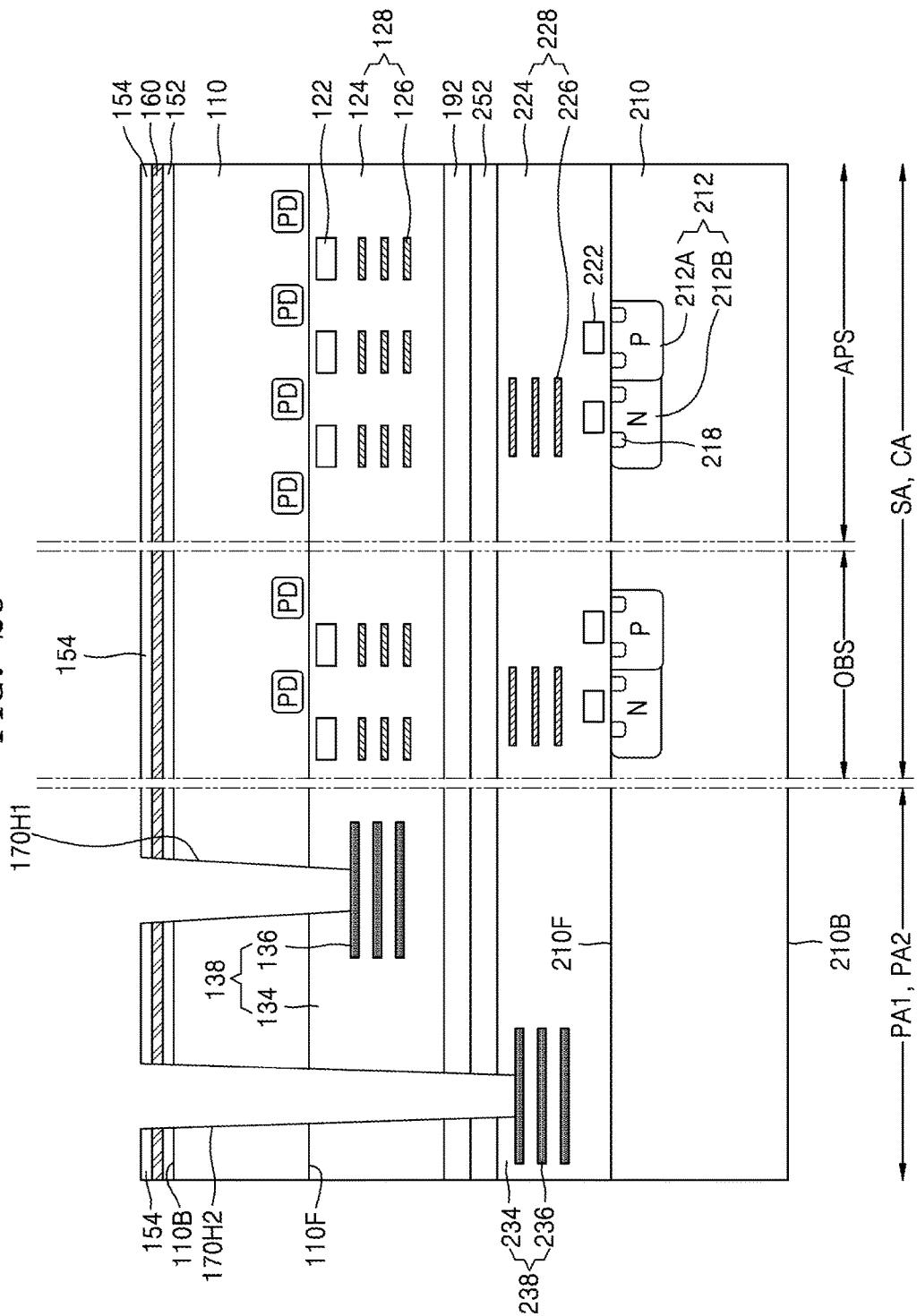

Referring to FIG. 20, in the first pad area PA1, a second insulating layer 154 may be formed on the heat spreading layer 160. Thereafter, the second insulating layer 154, the heat spreading layer 160, and the first insulating layer 152 may be partially etched and removed from the first pad area PA1 by using a mask pattern (not shown). As a result, portions of the substrate 110 and the insulating interlayer 134 may be exposed. The exposed portions of the substrate 110 and the insulating interlayer 134 may be removed to form a first via hole 170H1. The first via hole 170H1 may penetrate the substrate 110 in the first pad area PA1 and expose the interconnection line 136 on the first pad area PA1.

In some example embodiments, during the etching process for forming the first via hole 170H1, an additional etching process may be further performed to penetrate the insulating interlayer 134, the third insulating layer 192, and the fourth insulating layer 252, remove a portion of the insulating interlayer 234, and expose the interconnection line 236 on the second substrate 210. When the additional etching process for forming the second via hole 170H2 is performed until the interconnection line 236 is exposed on the second substrate 210, the interconnection line 136 exposed by a bottom surface of the first via hole 170H1 may act as an etch stop layer so that the first via hole 170H1 may not be etched any longer. Thus, the second via hole 170H2 may be formed to a greater depth than the first via hole 170H1.

In some example embodiments, the first via hole 170H1 and the second via hole 170H2 may be formed by using different etching processes.

Thereafter, the etch mask pattern may be removed.

Figure 21:
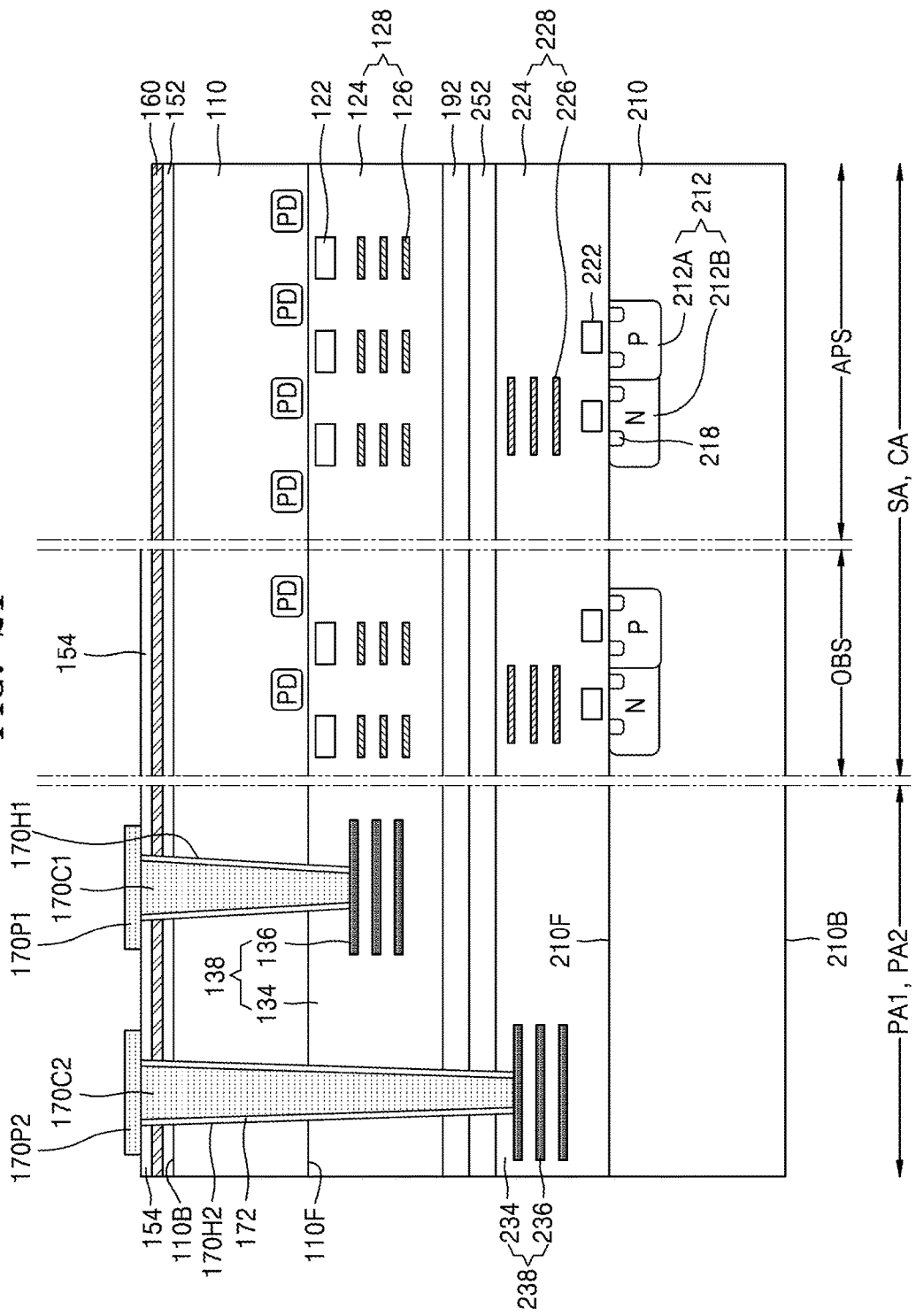

Referring to FIG. 21, a via insulating layer 172 may be formed on inner walls of the first and second via holes 170H1 and 170H2. The via insulating layer 172 may include an oxide layer, a nitride layer, a carbide layer, or a combination thereof. In some embodiments, the via insulating layer 172 may be formed by using a CVD process or a PVD process. Although not shown, a barrier layer may be formed.

Thereafter, the first and second via holes 170H1 and 170H2 may be filled with first and second connection vias 170C1 and 170C2, respectively. Each of the first and second connection vias 170C1 and 170C2 may include a plurality of metal layers. In an exemplary process of forming the first and second connection vias 170C1 and 170C2, a plurality of plating processes may be performed to form the plurality of metal layers.

Thereafter, a conductive layer (not shown) may be formed on the second insulating layer 154 and the first and second connection vias 170C1 and 170C2 and patterned, thereby forming first and second conductive pads 170P1 and 170P2 that are electrically connected to the first and second connection vias 170C1 and 170C2, respectively.

In another case, the formation of the first and second conductive pads 170P1 and 170P2 may include forming a conductive layer (not shown) on the second insulating layer 154 during the formation of the first and second conductive vias 170C1 and 170C2 and removing the conductive layer to leave only portions of the conductive layer located on the second insulating layer 154 around the first and second via holes 170H1 and 170H2.

A top surface of the heat spreading layer 160 may be exposed by removing the second insulating layer 154 from the active pixel sensor area APS.

Figure 22:
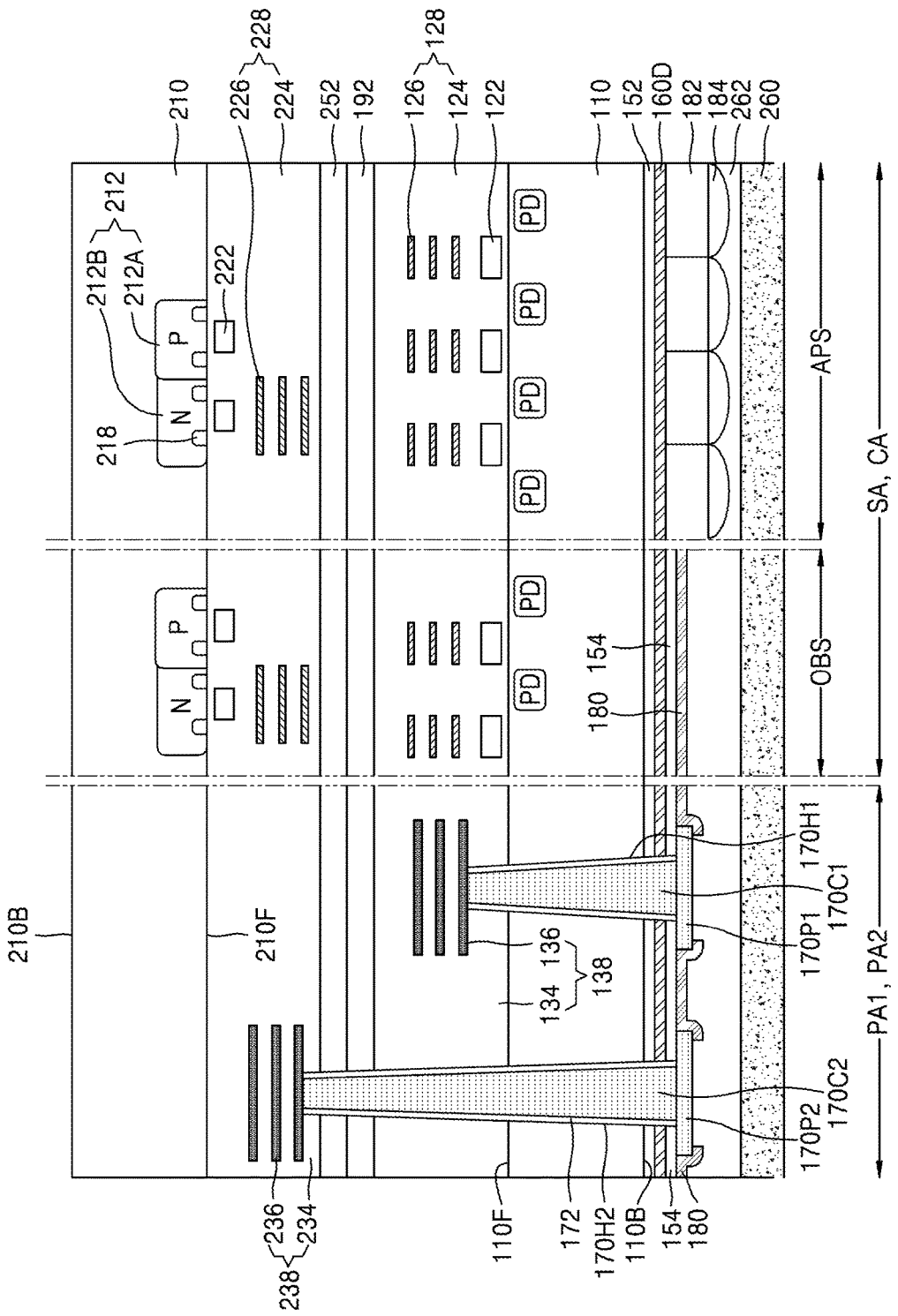

Referring to FIG. 22, a passivation layer 180 may be formed on the first and second conductive pads 170P1 and 170P2, the second insulating layer 154, and the heat spreading layer 160. The passivation layer 180 may be partially removed to expose top surfaces of the first and second conductive pads 170P1 and 170P2 in the first pad area PA and expose the top surface of the heat spreading layer 160 in the active pixel sensor area APS.

A color filter layer 182 and a microlens 184 may be sequentially formed on the heat spreading layer 160.

In some embodiments, during the formation of the color filter layer 182 and the microlens 184, the top surfaces of the first and second conductive pads 170P1 and 170P2 may be covered with a protection layer (not shown), a final passivation layer (not shown) may be formed on the color filter layer 182 and the microlens 184, and unnecessary layers covering the first and second conductive pads 170P1 and 170P2 may be removed to expose the first and second conductive pads 170P1 and 170P2 again.

Subsequently, a support substrate 260 may be adhered to the back surface 110B of the first substrate 110 on which the color filter layer 182 and the microlens 184 are formed. An adhesive member 262 may be interposed between the first substrate 110 and the support substrate 260 so that the support substrate 260 may be adhered to the back surface 110B of the first substrate 110.

A stacked structure of the first substrate 110 to which the support substrate 260 is adhered and the second substrate 210 may be turned upside down so that the back surface 210B of the second substrate 210 may face upward.

A thinning process may be performed to remove a desired (or, alternatively, predetermined) thickness from the back surface 210B of the second substrate 210. For example, the thinning process may be performed by using at least one of a CMP process, a BGR process, or an RIE process.

In the image sensor 100E, since the heat spreading layer 160 is located on the entire area of the active pixel sensor area APS, heat generated during operations of the circuits 20 (refer to FIG. 2) included in the circuit area CA may be uniformly distributed throughout the entire area of the sensor array area SA. Accordingly, non-uniform generation of dark current may be reduced and/or prevented in the sensor array area SA.

Figure 23:
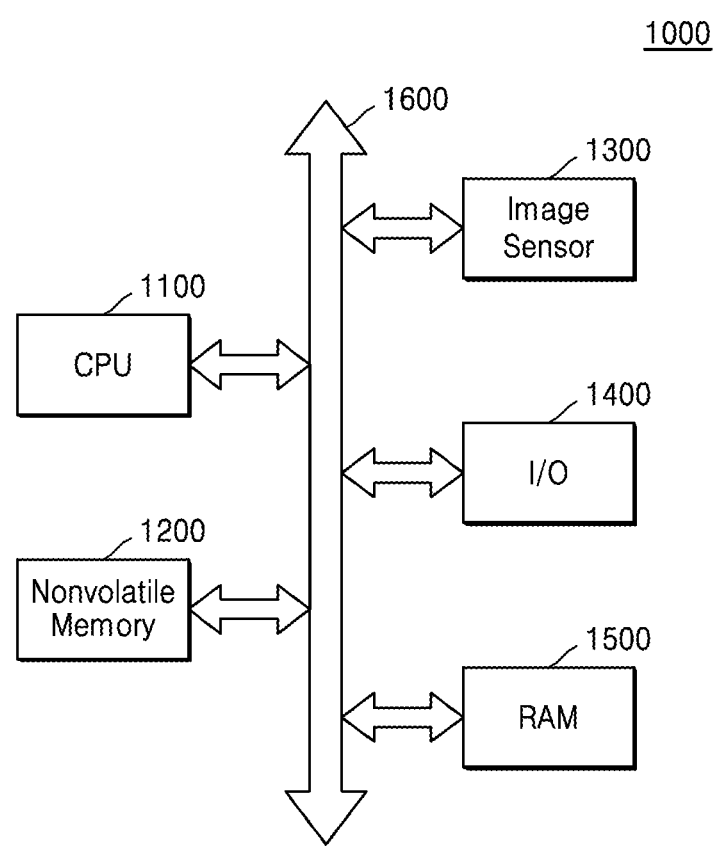
FIG. 23 is a block diagram of a system including an image sensor according to some example embodiments.

FIG. 23 is a block diagram of a system 1000 including an image sensor according to some example embodiments.

Referring to FIG. 23, the system 1000 may be any one of a computing system, a camera system, a camcorder, a portable phone, a scanner, a car navigation, a video phone, a security system, a game console, a medical micro-camera, a robot, or a motion detection system, which may utilize image data.

The system 1000 may include a central processing unit (CPU) (or a processor) 1100, a non-volatile memory 1200, an image sensor 1300, an input/output (I/O) device 1400, and a random access memory (RAM) 1500. The CPU 1100 may communicate with the non-volatile memory 1200, the image sensor 1300, the I/O device 1400, and the RAM 1500 via a bus 1600. The image sensor 1300 may be embodied by at least one of the image sensors 10, 10A, 100, 100A, 100B, 100C, 100D, 100E, 100F, 100G, 100H, and 100I described above with reference to FIGS. 1 to 22 according to some example embodiments or combined with the CPU 1100 into a single semiconductor package.

Figure 24:
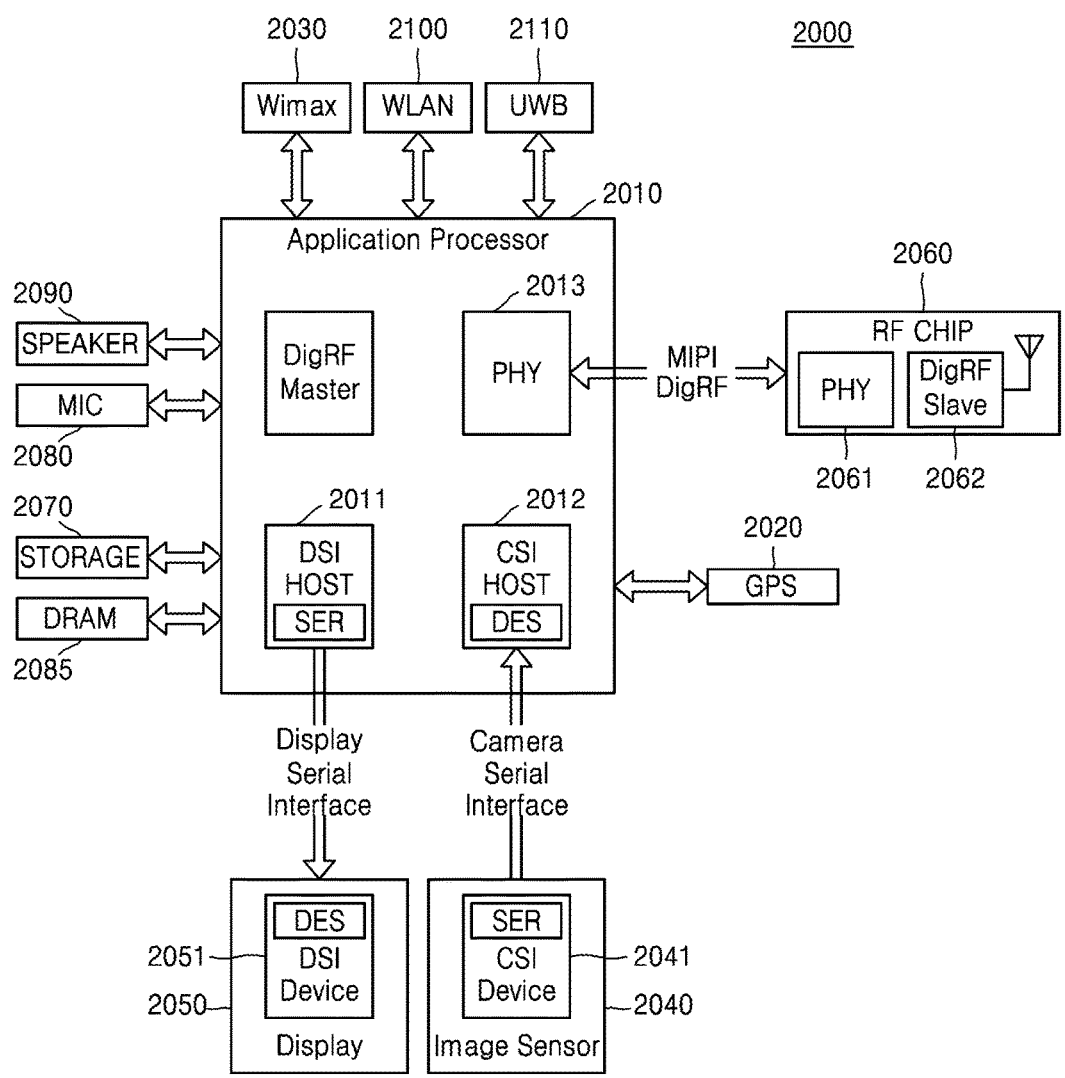
FIG. 24 is a diagram of an electronic system and interface including an image sensor according to some example embodiments.

FIG. 24 is a block diagram of an electronic system 2000 and interface including an image sensor according to some example embodiments.

Referring to FIG. 24, the electronic system 2000 may be embodied by a data processing device (e.g., a mobile phone, a personal digital assistant (PDA), a portable multimedia player (PMP), or a smartphone) capable of using or supporting a mobile industry processor interface (MIPI). The electronic system 2000 may include an application processor 2010, an image sensor 2040, and a display 2050.

A camera serial interface (CSI) host 2012 provided in the application processor 2010 may serial-communicate with a CSI device 2041 of the image sensor 2040 via a CSI. In this case, an optical deserializer is provided in the CSI host 2012, and an optical serializer may be provided in the CSI device 2041. The image sensor 2040 may include at least one of the image sensors 10, 10A, 100, 100A, 100B, 100C, 100D, 100E, 100F, 100G, 100H, and 100I described with reference to FIGS. 1 to 22, according to some example embodiments.

A display serial interface (DSI) host 2011 provided in the application processor 2010 may serial-communicate with a DSI device 2051 of the display 2050 via a DSI. In this case, for example, an optical serializer may be provided in the DSI host 2011, and an optical deserializer may be provided in the DSI device 2051.

The electronic system 2000 may further include an RF chip 2060 capable of communicating with the application processor 2010. A PHY 2013 of the electronic system 2000 may exchange data with a PHY 2061 of the RF chip 2060 based on MIPI DigRF.

The electronic system 2000 may further include a global positioning system (GPS) 2020, a storage 2070, a mike 2080, a dynamic random access memory (DRAM) 2085, and a speaker 2090. The electronic system 2000 may perform communication operations by using a worldwide interoperability for microwave access (WiMAX) 2030, a wireless local area network (WLAN) 2100, and an ultra-wideband (UWB) 2110.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An image sensor comprising:
   a first substrate, the first substrate including
      a first surface and a second surface, the first and second surfaces being opposite surfaces of the first substrate,
      an active pixel sensor area, the active pixel sensor area including a photoelectric conversion region,
      an optical black sensor area surrounding the active pixel sensor area, and
      a peripheral circuit area on one side of either the active pixel sensor area or the optical black sensor area;
   a microlens on the first surface;
   a multilayered interconnection structure on the second surface; and
   a heat spreading layer on the first surface and the second surface, the heat spreading layer vertically overlapping both the optical black sensor area and at least a portion of the peripheral circuit area, the heat spreading layer including a synthetic diamond layer, a graphene layer, or a diamond-like carbon (DLC) layer.

2. The image sensor of claim 1, wherein the heat spreading layer is between the first surface of the first substrate and the microlens.

3. The image sensor of claim 1, wherein the heat spreading layer is on the second surface such that the multilayered interconnection structure is between the heat spreading layer and the second surface.

4. The image sensor of claim 1, wherein the heat spreading layer vertically overlaps the active pixel sensor area.

5. The image sensor of claim 1, wherein the heat spreading layer is on a substantial entirety of the active pixel sensor area.

6. The image sensor of claim 1, wherein
   the optical black sensor area is on one side of the active pixel sensor area.

7. The image sensor of claim 1, wherein
   the heat spreading layer is on the multilayered interconnection structure, and
   the image sensor further comprises a heat radiation member, the heat radiation member being connected to at least a portion of the heat spreading layer.

8. The image sensor of claim 1, further comprising:
   a second substrate, the second substrate being electrically coupled to the active pixel sensor area through a connection via, the connection via extending through the first substrate, the second substrate having a top surface, the top surface of the second substrate facing the second surface of the first substrate, the second substrate including a circuit area,
   wherein the heat spreading layer is between the second surface of the first substrate and the top surface of the second substrate.

9. The image sensor of claim 1, wherein
   the heat spreading layer is on a substantial entirety of the first surface or the second surface,
   the multilayered interconnection structure includes an insulating interlayer and a plurality of interconnection lines, and
   each connection via extending through the first substrate to the plurality of interconnection lines is isolated from a first-substrate-distal surface of the multilayered interconnection structure by at least a portion of the insulating interlayer.

10. An image sensor comprising:
    a first substrate, the first substrate including
       a first surface and a second surface, the first and second surfaces being opposite surfaces of the first substrate, the first substrate including
       an active pixel sensor area, the active pixel sensor area including a photoelectric conversion region;
    a microlens on the first surface;
    a multilayered interconnection structure on the second surface; and
    a heat spreading layer on the first surface and the second surface, the heat spreading layer including a synthetic diamond layer, a graphene layer, or a diamond-like carbon (DLC) layer; and
    a second substrate, the second substrate being electrically coupled to the active pixel sensor area through a connection via, the connection via extending through the first substrate, the second substrate having a top surface, the top surface of the second substrate facing the second surface of the first substrate, the second substrate including a circuit area, wherein the heat spreading layer is between the second surface of the first substrate and the top surface of the second substrate.

11. The image sensor of claim 10, wherein the first substrate further comprises an optical black sensor area, the optical black sensor area being on one side of the active pixel sensor area, and the heat spreading layer vertically overlaps the optical black sensor area.

12. The image sensor of claim 10, wherein the heat spreading layer vertically overlaps an entire area of the active pixel sensor area.

13. The image sensor of claim 10, wherein the heat spreading layer is on a substantial entirety of the first surface or the second surface, the multilayered interconnection structure includes an insulating interlayer and a plurality of interconnection lines, and each connection via extending through the first substrate to the multilayered interconnection structure is isolated from a first-substrate-distal surface of the multilayered interconnection structure by at least a portion of the insulating interlayer.

14. An image sensor, comprising:

a substrate, the substrate including a sensor array, the sensor array including a plurality of unit pixels, each unit pixel including a photoelectric conversion region, each unit pixel configured to generate an electrical output signal, the plurality of unit pixels including at least one active pixel configured to generate active signals corresponding to wavelengths of external light and a plurality of optical black pixels configured to block external light and generate optical black signals, the optical black pixels surrounding the at least one active pixel; and a plurality of circuits on one side of either the at least one active pixel or the plurality of optical black pixels, the plurality of circuits configured to generate driving signals to drive one or more unit pixels of the plurality of unit pixels; and a heat spreading layer on a surface of the substrate, the heat spreading layer vertically overlapping both the plurality of optical black pixels and at least a portion of the plurality of circuits, the heat spreading layer configured to substantially uniformly distribute heat generated by at least one circuit of the plurality of circuits across at least a portion of the plurality of unit pixels.

15. The image sensor of claim 14, wherein the heat spreading layer is configured to substantially uniformly distribute heat generated by at least one circuit of the plurality of circuits across an entirety of the plurality of unit pixels.

16. The image sensor of claim 14, wherein the plurality of unit pixels comprises a plurality of active pixels, the plurality of optical black pixels surrounding the active pixels; and the heat spreading layer is on at least the plurality of active pixels.

17. The image sensor of claim 16, wherein the heat spreading layer is on both the plurality of active pixels and the plurality of optical black pixels.

* * * * *